United States Patent [19]
Saito et al.

[11] Patent Number: 6,153,062
[45] Date of Patent: Nov. 28, 2000

[54] MAGNETORESISTIVE SENSOR AND HEAD

[75] Inventors: Masamichi Saito; Toshinori Watanabe, both of Niigata-ken, Japan

[73] Assignee: Alps Electric Co., Ltd., Tokyo, Japan

[21] Appl. No.: 09/208,354

[22] Filed: Dec. 10, 1998

Related U.S. Application Data

[62] Division of application No. 08/992,937, Sep. 3, 1997, Pat. No. 5,869,963.

[30] Foreign Application Priority Data

Sep. 12, 1996 [JP] Japan .................................... 8-242043
Dec. 13, 1996 [JP] Japan .................................... 8-334142

[51] Int. Cl.⁷ .................................................. C23C 14/35
[52] U.S. Cl. ................................ 204/192.2; 204/192.15; 204/192.21
[58] Field of Search ........................... 204/192.15, 192.2, 204/192.21

[56] References Cited

U.S. PATENT DOCUMENTS

| | | | |
|---|---|---|---|
| 5,159,513 | 10/1992 | Dieny et al. ............................. | 360/113 |
| 5,178,739 | 1/1993 | Barnes et al. ....................... | 204/192.12 |
| 5,206,590 | 4/1993 | Dieny et al. ............................. | 324/252 |
| 5,262,914 | 11/1993 | Chen et al. .............................. | 360/113 |
| 5,277,991 | 1/1994 | Satomi et al. ........................... | 428/611 |
| 5,287,238 | 2/1994 | Baumgart et al. ...................... | 360/113 |
| 5,373,238 | 12/1994 | McGuire et al. ....................... | 324/252 |
| 5,529,814 | 6/1996 | Tan et al. ................................ | 427/547 |
| 5,549,978 | 8/1996 | Iwasaki et al. ......................... | 428/692 |
| 5,666,247 | 9/1997 | Schultz .................................... | 360/113 |
| 5,768,067 | 6/1998 | Saito et al. .............................. | 360/113 |
| 5,869,963 | 2/1999 | Saito et al. .............................. | 324/252 |
| 5,898,547 | 4/1999 | Fontana, Jr. et al. ................... | 360/113 |
| 5,898,548 | 4/1999 | Dill et al. ................................ | 360/113 |
| 5,901,018 | 5/1999 | Fontana, Jr. et al. ................... | 360/104 |

*Primary Examiner*—Nam Nguyen
*Assistant Examiner*—Steven H. Ver Steeg
*Attorney, Agent, or Firm*—Brinks Hofer Gilson & Lione

[57] ABSTRACT

PtMn films are used as antiferromagnetic layers of a dual spin-valve type magnetoresistive sensor. An exchange anisotropic magnetic field is achieved regardless of whether the PtMn film is formed over or under the pinned magnetic layer. Also, an effective exchange anisotropic magnetic field is produced even with heat treatment at a relatively low temperature. Alternatively, a PtMn film is used as an antiferromagnetic layer of a spin-valve film laminate. The use of a PtMn film enables a sufficient exchange anisotropic magnetic field to be produced even with a relatively low heat treatment temperature and a relatively small film thickness. Therefore, the number of total layers of the spin-valve film laminate can be increased to increase a magnetoresistance ratio, and a total thickness of the spin-valve film laminate can be made relatively small.

15 Claims, 11 Drawing Sheets

MAGNETORESISTIVE SENSOR AND HEAD

This application is a division of Ser. No. 08/992,937, filing date Sep. 3, 1997, U.S. Pat. No. 5,869,963.

BACKGROUND OF THE INVENTION

1. Field of the Invention

The present invention relates to a spin-valve type magnetoresistive sensor wherein electrical resistance is changed depending on the relationship between the magnetization direction of a pinned magnetic layer and the magnetization direction of a free magnetic layer affected by an external magnetic field. More particularly, the present invention relates to a spin-valve type magnetoresistive sensor which has higher sensitivity of detection and is adaptable for high-density recording as the result of an improvement in structure and material properties of a spin-valve film laminate, as well as to a spin-valve type magnetoresistive head using the sensor.

2. Description of the Related Art

There are known spin-valve type and multilayer type as laminated structures capable of developing a GMR (Giant Magnetoresistive) effect.

FIG. 12 is a sectional view showing a conventional multilayer type GMR sensor.

The multilayer type GMR sensor has a laminated structure comprising pairs of a ferromagnetic material layer 9 and a non-magnetic electrically conductive layer 2 which are formed in plural number repeatedly from the bottom.

Generally, the ferromagnetic material layer 9 is made of a NiFe (nickel-iron) alloy or a CoFe (cobalt-iron) alloy, and the non-magnetic electrically conductive layer 2 is made of Cu (copper).

The ferromagnetic material layers 9 are positioned over and under the non-magnetic electrically conductive layer 2 in a laminated structure. Particularly, when the non-magnetic electrically conductive layer 2 is formed in a thickness on the order of 10–20 angstroms, the upper and lower ferromagnetic material layers 9 are magnetized into a single domain state in anti-parallel relation uniformly due to the RKKY interaction.

In the multilayer type GMR sensor, when the sensor is subject to a leakage magnetic field from a magnetic recording medium such as a hard disk, the magnetization direction of the ferromagnetic material layer 9 is varied to the same direction as the leakage magnetic field. A variation in the magnetization direction of the ferromagnetic material layer 9 changes electrical resistance, and this change in value of the electrical resistance results in a voltage change. The leakage magnetic field from the magnetic recording medium is detected based on the resulting voltage change.

Meanwhile, a magnetoresistance ratio (MR ratio) of the multilayer type GMR sensor amounts to the order of about 10–30% when an external magnetic field is in the range of several tens Oe (oersted) to several thousands Oe. The reason why the magnetoresistance ratio has a very large value is that there are a very large number of places where electrons scattering can occur. Further, a very strong external magnetic field is required to achieve such a high magnetoresistance ratio. This is because the magnetization direction of the ferromagnetic material layer 9 is firmly fixed in anti-parallel relation due to the RKKY interaction. It has been found from calculation of plane recording density based on the magnetoresistance ratio in the above range that the multilayer type GMR sensor is adaptable for the plane recording density up to value on the order of 100 Cb/in$^2$. But it has also been confirmed that when a relatively weak external magnetic field on the order of several Oe is applied, the magnetoresistance ratio of the multilayer type GMR sensor becomes smaller than that of a spin-valve type magnetoresistive sensor.

FIG. 13 shows a conventional single spin-valve type magnetoresistive sensor. This sensor comprises four layers, i.e., a free magnetic layer 1, a non-magnetic electrically conductive layer 2, a pinned magnetic layer 3 and an antiferromagnetic layer 4 from the top. Numerals 5, 5 on both sides denote hard bias layers. Denoted by 6, 7 are respectively a buffer layer and a barrier layer made of non-magnetic material, such as Ta (tantalum), and 8 is an electrically conductive layer. The pinned magnetic layer 3 is selected to have a greater coercive force than the free magnetic layer 1.

Because the pinned magnetic layer 3 and the antiferromagnetic layer 4 are formed in contact with each other, the pinned magnetic layer 3 is put into a single domain state in the Y-direction and has the magnetization direction fixed in the Y-direction under an exchange anisotropic magnetic field produced by exchange coupling at the boundary surface between the pinned magnetic layer 3 and the antiferromagnetic layer 4. By heat-treating (annealing) the sensor under a magnetic field applied thereto, the exchange anisotropic magnetic field can be produced at the boundary surface between the pinned magnetic layer 3 and the antiferromagnetic layer 4.

Also, the hard bias layers 5 magnetized in the X-direction affects the free magnetic layer 1 so that the magnetization direction of the free magnetic layer 1 is uniformly set in the X-direction. In other words, since the free magnetic layer 1 is put into a single domain state in the predetermined direction by the presence of the hard bias layers 5, the occurrence of Barkhausen noise can be prevented.

In the above single spin-valve type magnetoresistive sensor, a steady electric current is applied from the electrically conductive layers 8 to the free magnetic layer 1, the non-magnetic electrically conductive layer 2 and the pinned magnetic layer 3. A magnetic recording medium such as a hard disk runs in the Z-direction. When a leakage magnetic field from the magnetic recording medium is applied to the sensor in the Y-direction, the magnetization direction of the free magnetic layer 1 is varied from the X-direction to the Y-direction. Thus, electrical resistance is changed depending on the relationship between a variation in the magnetization direction of the free magnetic layer 1 and the fixed magnetization direction of the pinned magnetic layer 3. This change in value of electrical resistance result in a voltage change. The leakage magnetic field from the magnetic recording medium is detected based on the resulting voltage change.

FIG. 14 is a sectional view showing a conventional dual spin-valve type magnetoresistive sensor.

In the dual spin-valve type magnetoresistive sensor, non-magnetic electrically conductive layers 2, 2, pinned magnetic layers 3, 3 and antiferromagnetic layers 4, 4 are formed into laminated structures on both sides of a free magnetic layer 1 at the middle in vertically symmetric relation. The magnetization direction of the free magnetic layer 1 is uniformly set in the X-direction by the presence of hard bias layers 5 magnetized in the X-direction. Also, the pinned magnetic layers 3, 3 are each put into a single domain state in the Y-direction and have the magnetization direction fixed in the Y-direction under an exchange anisotropic magnetic field produced by exchange coupling at the boundary surface between itself and the antiferromagnetic layer 4.

When a leakage magnetic field from the magnetic recording medium is applied to the sensor in the Y-direction, the magnetization direction of the free magnetic layer 1 is varied from the X-direction to the Y-direction, whereupon a value of electrical resistance is changed.

In the spin-valve type magnetoresistive sensor, when the magnetization direction of the free magnetic layer 1 is varied from the X-direction to the Y-direction, electrons existing between the free magnetic layer 1 and the pinned magnetic layer 3 and tending to move from one to the other are scattered at the boundary surface between the non-magnetic electrically conductive layer 2 and the free magnetic layer 1 and at the boundary surface between the non-magnetic electrically conductive layer 2 and the pinned magnetic layer 3. As a result, the value of electrical resistance is changed and the leakage magnetic field from the magnetic recording medium is detected based on the resulting voltage change.

The electrical resistance shows a maximum value when an angle formed between the magnetization direction of the free magnetic layer 1 and the magnetization direction of the pinned magnetic layer 3 is maximized, i.e., when these two layers are magnetized in anti-parallel relation, and shows a minimum value when the magnetization direction of the free magnetic layer 1 and the magnetization direction of the pinned magnetic layer 3 are the same. Thus, as a magnetoresistance ratio, i.e., {(maximum voltage value minimum voltage value)/minimum voltage value}, has a larger value when subject to the leakage magnetic field from the magnetic recording medium, the spin-valve type magnetoresistive sensor and hence a spin-valve type magnetoresistive head using the sensor have better characteristics.

Further, a detection output of the leakage magnetic field also greatly depends on the magnitude of a steady electric current (sensing electric current). The larger the steady electric current, the larger will be the detection output. However, if the density of the electric current flowing through the free magnetic layer 1, the non-magnetic electrically conductive layer 2 and the pinned magnetic layer 3 is too large, resulting Joule heat would give rise to problems of reducing the detection output, reliability and durability, and hence deteriorating characteristics of the spin-valve type magnetoresistive sensor. It has been confirmed that an upper limit value of the steady electric current allowing the spin-valve type magnetoresistive sensor to have satisfactory characteristics is $3 \times 10^7$ A/cm$^2$. Incidentally, the upper limit value of the steady electric current can be raised by increasing the total number of layers making up the structure of the spin-valve type magnetoresistive sensor.

In the single spin-valve type magnetoresistive sensor shown in FIG. 13, electron scattering occurs at two places, i.e., the boundary surface between the non-magnetic electrically conductive layer 2 and the free magnetic layer 1 and the boundary surface between the non-magnetic electrically conductive layer 2 and the pinned magnetic layer 3. On the other hand, in the dual spin-valve type magnetoresistive sensor shown in FIG. 14, electron scattering occurs at four places in total, i.e., the two boundary surfaces between the non-magnetic electrically conductive layers 2 and the free magnetic layer 1 and the two boundary surfaces between the non-magnetic electrically conductive layers 2 and the pinned magnetic layers 3. Therefore, the dual spin-valve type magnetoresistive sensor has a larger magnetoresistance ratio than the single spin-valve type magnetoresistive sensor.

To make the sensor adaptable for high-density recording, it is important to improve the plane recording density. To improve the plane recording density, it is required to increase an output reproduced by the sensor. Further, to increase the reproduction output, it is required to raise the magnetoresistance ratio which is proportional to the reproduction output.

As mentioned above, the multilayer type GMR sensor shown in FIG. 12 can provide the magnetoresistance ratio of about 30% at maximum when the external magnetic field of several thousands Oe is applied to the sensor. However, when the external magnetic field is very weak, the magnetoresistance ratio of the multilayer type GMR sensor becomes smaller than that of the spin-valve type magnetoresistive sensor.

Further, for the multilayer type GMR sensor, it is impossible to provide the hard bias layers and suppress the occurrence of Barkhausen noise unlike the spin-valve type magnetoresistive sensor.

The reason is that if the hard bias layers are provided in the multilayer type GMR sensor, all the layers of ferromagnetic material would be magnetized uniformly in the same direction as the magnetization direction of the hard bias layers, and hence that if the external magnetic field is applied to the multilayer type GMR sensor, the electrical resistance would not be changed and the sensor could not detect the leakage magnetic field of the magnetic recording medium.

In the conventional spin-valve type magnetoresistive sensors, generally, the free magnetic layer 1 and the pinned magnetic layer 3 are each formed of, e.g., a FeNi (iron-nickel-alloy film, and the non-magnetic electrically conductive layer 2 is formed of, e.g., a Cu (copper) film. In the conventional single spin-valve type magnetoresistive sensor, a FeMn (iron-manganese) alloy film is generally used as antiferromagnetic material of the antiferromagnetic layer 4.

However, the FeMn film has a disadvantage that it is susceptible to corrosion and would be rusted soon if exposed to air containing moisture. Further, the blocking temperature for exchange coupling between the FeMn alloy film as ferromagnetic material and the FeNi alloy film constituting the pinned magnetic layer is as low as on the order of about 150° C. This raises another disadvantage that if the temperature of a magnetoresistive head becomes high due to the heat generated by itself and the ambient temperature during operation, the exchange anisotropic magnetic field is weakened and noise in the detection output is increased.

As ferromagnetic material substitutable for the FeMn alloy, there are an IrMn (iridium-manganese) alloy, a RhMn (rhodium-manganese) alloy, etc.

However, films of the FeMn (iron-manganese) alloy, the IrMn (iridium-manganese) alloy, the RhMn (rhodium-manganese) alloy, etc. have properties as follows. When these alloy films are formed over the ferromagnetic material, such as an FeNi alloy, constituting the pinned magnetic layer 3, any alloy film can develop exchange coupling at the boundary surface between itself and the pinned magnetic layer 3. But those antiferromagnetic materials have such features that they are easily affected by underlying layers and their films are hard to exhibit antiferromagnetic characteristics in the vicinity of their upper surfaces. Accordingly, when the pinned magnetic layer 3 is formed over any film of those antiferromagnetic materials, it is difficult for the film of the antiferromagnetic material to develop exchange coupling.

On the contrary, films of other antiferromagnetic materials such as a CoO (cobalt oxide) alloy and a NiO (nickel oxide) alloy can each develop exchange coupling at the boundary surface between itself and the pinned magnetic layer 3 when the film is formed under the ferromagnetic material constituting the pinned magnetic layer 3. However, the films of those antiferromagnetic materials such as a CoO alloy and a NiO alloy have a feature of showing dependency in degree of crystallinity. More specifically, each film of those antiferromagnetic materials is hard to develop a satisfactory degree of crystallization in the vicinity of the boundary surface between itself and an underlying layer at start-up of a vacuum film forming process using the sputtering method, for example, attains better growth of crystals at a position farther away from the buffer layer, and hence has a difficulty in exhibiting satisfactory antiferromagnetic characteristics in the vicinity of its lower surface. Accordingly, when the pinned magnetic layer 3 is formed under any film of those antiferromagnetic materials, it is difficult for the film of the antiferromagnetic material to develop exchange coupling.

Thus, the above-mentioned antiferromagnetic materials can develop effective exchange coupling only when formed on one side of, i.e., either over or under, the pinned magnetic layer 3. Therefore, the above-mentioned antiferromagnetic materials cannot be employed in the structure of the dual spin-valve type magnetoresistive sensor shown in FIG. 14 wherein the antiferromagnetic layers 4, 4 are formed over and under the pinned magnetic layers 3, 3.

There is known a NiMn (nickel-manganese) alloy as material capable of producing an exchange anisotropic magnetic field regardless of whether its film is formed over or under the pinned magnetic layer 3. This antiferromagnetic material can be formed on both sides of, i.e., over and under, the pinned magnetic layer 3 and can be used in the dual spin-valve type magnetoresistive sensor shown in FIG. 14.

To develop effective exchange coupling between a NiMn alloy film and a FeNi alloy film (pinned magnetic layer 3), however, annealing is required to be carried out at a relatively high temperature. Generally, to produce an exchange anisotropic magnetic field, it is necessary to apply a magnetic field and carry out annealing after the antiferromagnetic layer 4 and the pinned magnetic layer 3 are formed in contact relation. In the case where the antiferromagnetic layer 4 is formed of a NiMn alloy film and the pinned magnetic layer 3 is formed of a FeNi alloy film, the annealing temperature as high as about 250° C. or above is required to develop effective exchange coupling therebetween.

But the annealing at a high temperature of about 250° C. or above would raise a problem below. There occurs diffusion of metallic elements at the boundary surfaces of the free magnetic layer 1 and the pinned magnetic layer 3 adjacent to the non-magnetic electrically conductive layer 2 of Cu. This affects the magnetoresistive effect due to electron diffusion occurred at the boundary surface between the free magnetic layer 1 and the non-magnetic electrically conductive layer 2 and the boundary surface between the pinned magnetic layer 3 and the non-magnetic electrically conductive layer 2. The magnetoresistance ratio depending on the external magnetic field is thereby reduced.

Meanwhile, to make the sensor adaptable for high-density recording, it is important to not only improve the plane recording density, but also reduce a magnetic gap length. When the antiferromagnetic layer is formed of a NiMn alloy film, a good exchange anisotropic magnetic field cannot be achieved unless the antiferromagnetic layer must have a film thickness on the order of several hundreds angstroms. Therefore, a thickness h' of the multilayered films shown in FIG. 14 is necessarily increased and hence the magnetic gap length cannot be made small. Incidentally, the free magnetic layer 1, the non-magnetic electrically conductive layer 2 and the pinned magnetic layer 3 have each a film thickness on the order of several tens angstroms.

The magnetoresistance ratio of the single spin-valve type magnetoresistive sensor is in the range of 3 to 9%. Calculation of plane recording density based on the magnetoresistance ratio in the above range results in that the single spin-valve type magnetoresistive sensor is adaptable for the plane recording density up to values on the order of 10 $Gb/in^2$.

SUMMARY OF THE INVENTION

With the view of solving the above problems of the conventional multilayer type GMR sensor, the conventional single spin-valve type magnetoresistive sensor and the conventional dual spin-valve type magnetoresistive sensor, an object of the present invention is to provide a spin-valve type magnetoresistive sensor and a spin-valve type magnetoresistive head using the sensor, which can achieve a satisfactory magnetoresistance ratio even with a weaker external magnetic field than usually applied to the multilayer type GMR sensor, which can achieve a larger magnetoresistance ratio than achieved by the single spin-valve type magnetoresistive sensor, and which can achieve higher sensitivity and a greater detection output with a weaker external magnetic field.

Another object of the present invention is to provide a spin-valve type magnetoresistive sensor and a spin-valve type magnetoresistive head using the sensor, in which an antiferromagnetic layer is made of a PtMn (platinum manganese) alloy or the like so that the temperature of heat treatment (annealing) causing the antiferromagnetic layer to develop exchange coupling can be lowered, and an effective exchange anisotropic magnetic field can be produced even with a smaller film thickness of the antiferromagnetic layer so that a magnetic gap length can be reduced.

Still another object of the present invention is to provide a spin-valve type magnetoresistive sensor and a spin-valve type magnetoresistive head using the sensor, with which the temperature of heat treatment (annealing) causing an antiferromagnetic layer to develop exchange coupling can be lowered to prevent diffusion of metallic elements and electrons at the boundary surfaces of a free magnetic layer and a pinned magnetic layer adjacent to a non-magnetic electrically conductive layer, and which can achieve a higher magnetoresistance ratio.

Still another object of the present invention is to provide a dual spin-valve type magnetoresistive sensor and a dual spin-valve type magnetoresistive head using the sensor, in which an antiferromagnetic layer is made of a PtMn (platinum-manganese) alloy or the like so that an effective exchange anisotropic magnetic field can be produced regardless of whether the antiferromagnetic layer is formed over or under the pinned magnetic layer.

A dual spin-valve type magnetoresistive sensor according to a first aspect of the present invention comprises non-magnetic electrically conductive layers formed over and under a free magnetic layer, pinned magnetic layers lying over one of the non-magnetic electrically conductive layers and under the other of the non-magnetic electrically conductive layers, antiferromagnetic layers lying over one of the pinned magnetic layers and under the other of the pinned magnetic layers to make the magnetization direction of the pinned magnetic layers fixed in a predetermined direction due to respective exchange anisotropic magnetic fields, and bias layers for magnetizing the free magnetic layer uniformly in a direction crossing the magnetization direction of the pinned magnetic layers, the antiferromagnetic layers being made of a PtMn (platinum-manganese) alloy.

According to a second aspect of the present invention, in a spin-valve type magnetoresistive sensor comprising a pinned magnetic layer having the magnetization direction fixed in a predetermined direction due to an exchange anisotropic magnetic field produced between the pinned magnetic layer and an antiferromagnetic layer, and a free magnetic layer having the magnetization direction varied with a leakage magnetic field from a magnetic recording medium, the sensor includes a first film laminate made by forming a non-magnetic electrically conductive layer and a pinned magnetic layer successively over a free magnetic layer, a second film laminate made by forming a non-magnetic electrically conductive layer and a free magnetic layer successively over a pinned magnetic layer, the second film laminate being formed over the first film laminate with an antiferromagnetic layer interposed therebetween, and electrically conductive layers for applying a steady electric current to the first and second film laminates.

The spin-valve type magnetoresistive sensor according to the second aspect of the present invention is shown in FIG. 5. This magnetoresistive sensor has such a structure that one single type spin-valve film laminate "i" is formed on the other single type spin-valve film laminate "ii" with the antiferromagnetic layer shared by both the film laminates. Therefore, the magnetoresistance ratio of this spin-valve type magnetoresistive sensor is larger than not only the magnetoresistance ratio (3–9%) of the single spin-valve type magnetoresistive sensor (FIG. 13), but also the magnetoresistance ratio (5–13%) of the dual spin-valve type magnetoresistive sensor (FIG. 1). Since an upper value of the steady electric current can be raised, it is also expected for this sensor to produce a higher magnetic detection output than those of the single spin-valve type magnetoresistive sensor and the dual spin-valve type magnetoresistive sensor.

According to a third aspect of the present invention, in a spin-valve type magnetoresistive sensor comprising a pinned magnetic layer having the magnetization direction fixed in a predetermined direction due to an exchange anisotropic magnetic field produced between the pinned magnetic layer and an antiferromagnetic layer, and a free magnetic layer having the magnetization direction varied with a leakage magnetic field from a magnetic recording medium, the sensor includes a first film laminate made by forming a non-magnetic electrically conductive layer and a pinned magnetic layer successively over a free magnetic layer, a second film laminate made by forming a non-magnetic electrically conductive layer and a free magnetic layer successively over a pinned magnetic layer, a third 5-layer film laminate made by forming a non-magnetic electrically conductive layer, a free magnetic layer, a non-magnetic electrically conductive layer and a pinned magnetic layer successively over a pinned magnetic layer, the third film laminate being formed over the first film laminate with an antiferromagnetic layer interposed therebetween, the second film laminate being formed over the third film laminate with an antiferromagnetic layer interposed therebetween, and electrically conductive layers for applying a steady electric current to the first, second and third film laminates.

A spin-valve film laminate of the spin-valve type magnetoresistive sensor according to the third aspect of the present invention is shown in FIG. 6. This spin-valve film laminate has such a structure that a dual-type spin-valve film laminate "i" is formed over one single type spin-valve film laminate "iii" with one antiferromagnetic layer shared by both the film laminates, and the other single type spin-valve film laminate "ii" is formed over the dual type spin-valve film laminate "i" with the other antiferromagnetic layer shared by both the film laminates. Accordingly, the magnetoresistance ratio of this spin-valve type magnetoresistive sensor is higher than that of the dual spin-valve type magnetoresistive sensor. Further, because of a higher magnetoresistance ratio and a raised upper limit value of the steady electric current, it is expected that the reproduction output of this spin-valve type magnetoresistive sensor is about three or more times that of the single spin-valve type magnetoresistive sensor.

According to a fourth aspect of the present invention, in a spin-valve type magnetoresistive sensor comprising a pinned magnetic layer having the magnetization direction fixed in a predetermined direction due to an exchange anisotropic magnetic field produced between the pinned magnetic layer and an antiferromagnetic layer, and a free magnetic layer having the magnetization direction varied with a leakage magnetic field from a magnetic recording medium, the sensor includes a 5-layer film laminate (the third film laminate) made by forming a non-magnetic electrically conductive layer, a free magnetic layer, a non-magnetic electrically conductive layer and a pinned magnetic layer successively over a pinned magnetic layer, the film laminate being stacked in multiple stages with an antiferromagnetic layer interposed between every two film laminates, antiferromagnetic layers formed each under the pinned magnetic layer lying as a lowermost layer of the film laminate at the lowermost stage and over the pinned magnetic layer lying as an uppermost layer of the film laminate at the uppermost stage, and electrically conductive layers for applying a steady electric current to the film laminates.

A spin-valve film laminate of the spin-valve type magnetoresistive sensor according to the fourth aspect of the present invention is shown in FIG. 7. This spin-valve film laminate has such a structure that the above dual type spin-valve film laminate "i" is stacked in multiple stages with the antiferromagnetic layer shared by every two adjacent film laminates. The magnetoresistance ratio of this spin-valve type magnetoresistive sensor is higher than that of the dual spin-valve type magnetoresistive sensor. Further, because of a higher magnetoresistance ratio and a raised upper limit value of the steady electric current, it is expected that the reproduction output of this spin-valve type magnetoresistive sensor is two or more times that of the dual spin-valve type magnetoresistive sensor.

According to any of the first to fourth aspects of the present invention, the magnetization direction of the pinned magnetic layer is kept fixed under an exchange anisotropic magnetic field produced between itself and the antiferromagnetic layer, and electrical resistance is changed upon a change in the magnetization direction of the free magnetic layer resulted from an external magnetic field such as a leakage magnetic field applied from a magnetic recording medium. Therefore, a change in electrical resistance can be caused by a magnetic field of several Oe as with the conventional single spin-valve type magnetoresistance sensor. Thus, the sensor according to any aspect of the present invention is more practical than multilayer type GMR sensors wherein electrical resistance can be changed unless a magnetic field of several tens Oe to several thousands Oe is applied.

In the spin-valve type magnetoresistance sensor according to any aspect of the present invention, bias layers for magnetizing each free magnetic layer uniformly in a direction crossing the magnetization direction of the pinned magnetic layers are preferably formed on both the entire film laminate. The provision of the bias layers is effective in suppressing the occurrence of Barkhausen noise. The magnetoresistive sensor wherein Barkhausen noise is reduced by forming the bias layers can be used as a magnetic head for detecting a leakage magnetic field from a magnetic recording medium such as a hard disk. Note that the bias layers are not necessarily required in the sensor of the present invention. The sensor having no bias layers can be employed as a magnetic sensor in applications where the effect of Barkhausen noise is not problematic.

While each antiferromagnetic layer is preferably made of a PtMn (platinum-manganese) alloy, it may be made of a Pt—Mn—X (X=any of Ni, Pd, Rh, Ru, Ir, Cr, Fe and Co) alloy or a PdMn (palladium-manganese) alloy instead of the PtMn alloy.

Preferably, the PtMn alloy has a film composition consisted of Pt in the range of 44—51 at % and Mn in the range of 49—56 at %.

In the present invention, a PtMn alloy film or any of PdMn and other suitable alloy films that have comparable properties to the PtMn alloy is used as antiferromagnetic material of the antiferromagnetic layer. Those antiferromagnetic materials can produce an effective exchange anisotropic magnetic field between the boundary surface between the antiferromagnetic and the pinned magnetic layer regardless of whether the antiferromagnetic layer is formed over or under the ferromagnetic material of the pinned magnetic layer. Therefore, a sufficient magnetoresistive effect can be achieved by using any of those antiferromagnetic materials in the dual spin-valve type magnetoresistive sensor wherein the pinned magnetic layers are arranged on both sides of the free magnetic layer in vertically symmetric relation and the antiferromagnetic layers are formed each over one pinned magnetic layer and under the other pinned magnetic layer, as well as in the spin-valve type magnetoresistive sensors of laminated structure according to the second to fourth aspects of the present invention.

Also, by using a PtMn alloy film or any of PdMn and other suitable alloy films as the antiferromagnetic layer, a sufficient exchange anisotropic magnetic field can be produced even with the heat treatment after forming the films carried out at a temperature not higher than 230° C. Therefore, during the process of heat treatment, metallic elements and electrons are prevented from diffusing at the boundary surfaces of the non-magnetic electrically conductive layers adjacent to the pinned magnetic layer and the free magnetic layer. Consequently, a high magnetoresistance ratio can be achieved when an external magnetic field is applied.

It has been confirmed that the antiferromagnetic layer made of any of the above-mentioned materials can produce an exchange anisotropic magnetic field on the order of 300 Oe even with the antiferromagnetic layer having a very thin film thickness of about 100 angstroms. Therefore, the spin-valve film laminates of multilayer structure can be reduced in thickness.

Further, the PtMn alloy film has superior corrosion resistance to the FeMn and NiMn alloy films and is not corroded at all when subject to various solvents and cleaning agents used in the manufacture process of the spin-valve type magnetoresistive sensors and heads. Thus, the PtMn alloy film remains chemically stable during operation of the magnetoresistive heads under severe environments.

Moreover, the exchange anisotropic magnetic field produced upon contact of the PtMn alloy film and the pinned magnetic layer is thermally highly stable and has a blocking temperature as high as about 380° C. Therefore, even if the temperature of the magnetoresistive heads is raised during the operation, it is possible to produce a stable exchange anisotropic magnetic field and stabilize accuracy of reading.

Additionally, in the present invention, a film thickness of the antiferromagnetic layer can be made smaller than conventional by using a PtMn alloy film as antiferromagnetic material of the antiferromagnetic layer. Accordingly, even when the spin-valve film laminate is made up of the increased number of total layers, a total thickness of the spin-valve film laminate is not significantly increased and a reduction in the magnetic gap length can be realized.

In the above magnetoresistive sensors of the present invention, the free magnetic layer and the pinned magnetic layers are made of, e.g., a FeNi (iron-nickel) alloy.

Alternatively, the free magnetic layer and the pinned magnetic layers are made of any of Co (cobalt), a FeCo (iron-cobalt) alloy and a Fe—Co—Ni (iron-cobalt-nickel) alloy.

DESCRIPTION OF THE PREFERRED EMBODIMENTS

Figure 1:
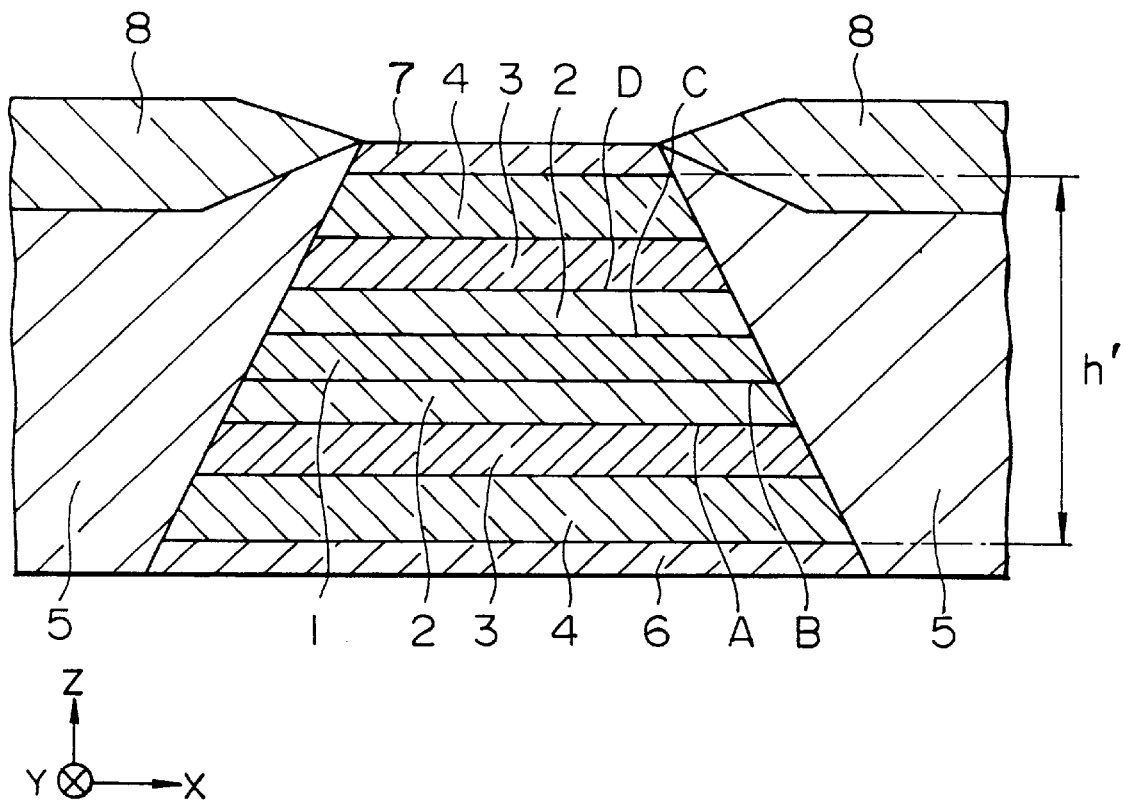
FIG. 1 is an enlarged sectional view showing the structure of a dual spin-valve type magnetoresistive head according to a first embodiment of the present invention.

FIG. 1 is a sectional view showing the structure of a dual spin-valve type magnetoresistive head according to a first embodiment of the present invention.

The illustrated magnetoresistive head is attached to, for example, a trailing side end of a floating slider provided in a hard disk unit. In FIG. 1, a magnetic recording medium such as a hard disk is moved in the Z-direction and a leakage magnetic field from the magnetic recording medium is generated in the Y-direction.

Formed at the bottom in FIG. 1 is a buffer layer 6 made of non-magnetic material such as Ta (tantalum). Over the buffer layer 6, there are successively formed a antiferromagnetic layer 4 made of a PtMn (platinum-manganese) alloy and a pinned magnetic layer 3 made of a FeNi (iron-nickel) alloy. A non-magnetic electrically conductive layer 2 made of Cu (copper) or the like is formed over the pinned magnetic layer 3, and a free magnetic layer 1 made of a FeNi alloy is formed over the non-magnetic electrically conductive layer 2. Further, over the free magnetic layer 1, there are successively formed a separate non-magnetic electrically conductive layer 2, a separate pinned magnetic layer 3 and a separate antiferromagnetic layer 4. Additionally, a barrier layer 7 made of Ta or the like is formed at the top of the above laminate.

After lamination of the antiferromagnetic layer 4 and the pinned magnetic layer 3, by heat-treating (annealing) the laminate under a magnetic field of predetermined magnitude, an exchange anisotropic magnetic field is produced at the boundary surface between the two layers, and the pinned magnetic layer 3 is put into a single domain state to have the magnetization direction fixed in the Y-direction. When the antiferromagnetic layer 4 is made of a PtMn alloy and the pinned magnetic layer 3 is made of a FeNi alloy, exchange coupling can occur in both the case where the antiferromagnetic layer 4 is formed under the pinned magnetic layer 3 and the case where the antiferromagnetic layer 4 is formed over the pinned magnetic layer 3.

Incidentally, an exchange anisotropic magnetic field can also be produced at the boundary surface between the antiferromagnetic layer 4 and the pinned magnetic layer 3 when the pinned magnetic layer 3 is made of Co (cobalt), a Fe—Co (iron-cobalt) alloy, or a Fe—Co—Ni (iron-cobalt-nickel) alloy.

After the multilayer films from the buffer layer 6 to the barrier layer 7 have been all formed by sputtering and etched into a predetermined sectional shape, hard bias layers 5 for applying a bias magnetic field to the free magnetic field 1 are formed. The hard bias layers 5 are magnetized in the X-direction so that the magnetization direction of the free magnetic layer 1 is uniformly set in the X-direction. Further, electrically conductive layers 8, 8 made of W (tungsten) or Cu (Copper), for example, are formed respectively on the hard bias layers 5, 5.

In the dual spin-valve type magnetoresistive head formed as described above, when a steady electric current is applied to the free magnetic layer 1, the non-magnetic electrically conductive layers 2 and the pinned magnetic layers 3 from the electrically conductive layers 8, and simultaneously a magnetic field is applied from a magnetic recording medium in the Y-direction, the magnetization direction of the free magnetic layer 1 is varied from the X-direction to the Y-direction. At this time, electrons tending to move from the free magnetic layer 1 to the pinned magnetic layer 3 or vice versa are scattered at the boundary surface between the non-magnetic electrically conductive layer 2 and the free magnetic layer 1 or at the boundary surface between the non-magnetic electrically conductive layer 2 and the pinned magnetic layer 3, thereby causing a change in electrical resistance. As a result, the steady electric current is changed and a detection output of the magnetic field applied from the magnetic recording medium is produced.

The PtMn alloy used to form the antiferromagnetic layer 4 in the present invention is superior in corrosion resistance to other alloys of FeMn (iron-manganese) and NiMn (nickel-manganese). Accordingly, it is possible to prevent head characteristics from deteriorating due to corrosion.

One example of the film laminate using a PtMn alloy film as the antiferromagnetic layer and the dual spin-valve type magnetoresistive head using the film laminate will be described below.

A dual spin-valve type magnetoresistive sensor (FIG. 1) and a single spin-valve type magnetoresistive sensor (FIG. 13) were formed with an X-directional sensor width (track width) of 2.2 μm and a Y-directional sensor length (MR height) of 1.5 μm.

The dual spin-valve type magnetoresistive sensor had a film laminate constructed such that a film of aluminum oxide ($Al_2O_3$) as non-magnetic material was formed over a silicon (Si) substrate and multiple films from the buffer layer 6 to the barrier layer 7 were formed over the film of aluminum oxide in the order explained above as with the multilayered structure of FIG. 1. Selected film materials of the buffer layer 6 to the barrier layer 7 were Ta (3 nm)/PtMn (20 nm)/NiFe (4 nm)/Cu (2.5 nm)/NiFe (7 nm)/Cu (2.5 nm)/NiFe (4 nm)/PtMn (20 nm)/Ta (5 nm). Note that ( ) represents a thickness of each film.

Figure 13:
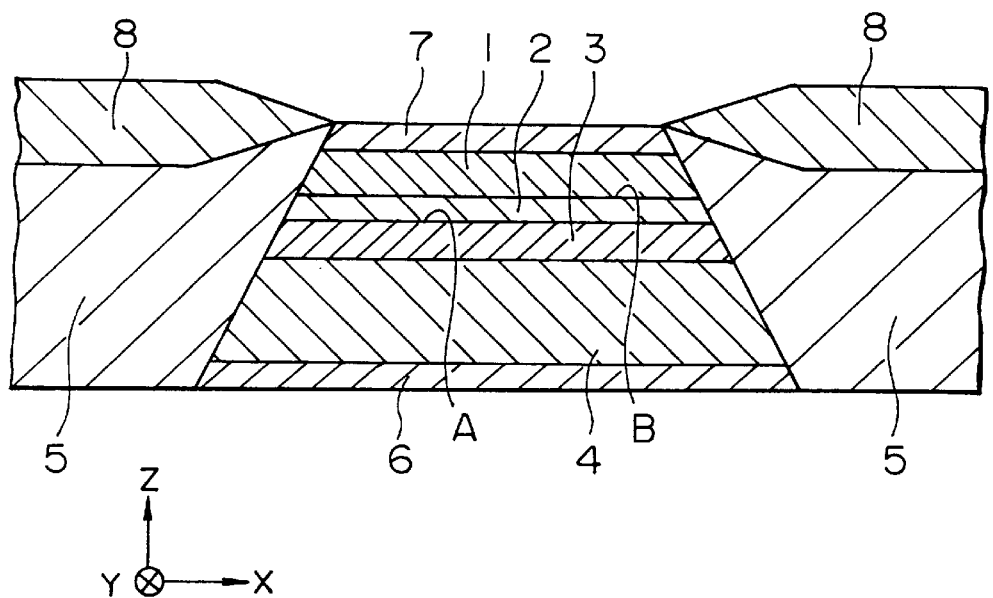
FIG. 13 is a sectional view of a conventional single spin-valve type magnetoresistive sensor.

The single spin-valve type magnetoresistive sensor had a film laminate constructed such that a film of aluminum oxide was formed over a silicon substrate and multiple films of buffer layer/antiferromagnetic layer/pinned magnetic layer/non-magnetic electrically conductive layer/free magnetic layer/barrier layer were formed over the film of aluminum oxide in the order named from the bottom as with the multilayered structure of FIG. 13. Practically selected film materials of the above layers were Ta (3 nm)/PtMn (30 nm)/NiFe (4 nm)/Cu (2.5 nm)/NiFe (8 nm)/Ta (5 nm) from the bottom.

In both the dual spin-valve type magnetoresistive sensor and the single spin-valve type magnetoresistive sensor, the PtMn film constituting the antiferromagnetic layer was selected to have a composition consisted of 48 at % Pt and 52 at % Mn (i.e., $Pt_{48}Mn_{52}$).

The above PtMn film was formed by the DC magnetron sputtering method using a PtMn alloy.

The dual spin-valve type magnetoresistive sensor was subject to heat treatment (annealing) at 230° C. This resulted in an exchange anisotropic magnetic field (Hex) of 470 Oe applied from the PtMn alloy film constituting the antiferromagnetic layer 4 to the FeNi alloy film constituting the pinned magnetic layer 3, and a coercive force (Hc) of 240 Oe in the pinned magnetic layer 3.

Further, as shown in FIG. 1, CoPt alloy films with a thickness of 30 nm were formed as the hard bias layers 5 on both sides of the film laminate of the dual spin-valve type magnetoresistive sensor, and as shown in FIG. 13, CoPt alloy films with a thickness of 20 nm were formed as the hard bias layers 5 on both sides of the film laminate of the single spin-valve type magnetoresistive sensor. The hard bias layers 5 had each remanent magnetization (Mr) of 0.9 T (tesla) and a coercive force of 1300 Oe.

When the film laminate was formed on a silicon substrate of 5 mm×25 mm, the dual spin-valve type magnetoresistive sensor showed a magnetoresistance ratio of 6.2% and sheet resistance of 10.8Ω/m², while the single spin-valve type magnetoresistive sensor showed a magnetoresistance ratio of 3.9% and sheet resistance of 16.3Ω/m².

Thus, the magnetoresistance ratio of the dual spin-valve type magnetoresistive sensor was greater than that of the single spin-valve type magnetoresistive sensor. This implies that the pinned magnetic layers 3, 3 formed over and under the free magnetic layer 1 are both magnetized fixedly in the Y-direction, and that both the antiferromagnetic layer 4 of a PtMn alloy formed under the pinned magnetic layer 3 and the antiferromagnetic layer 4 of a PtMn alloy formed over the pinned magnetic layer 3 are developing exchange coupling at the boundary surfaces between themselves and the pinned magnetic layers 3, 3.

Figure 14:
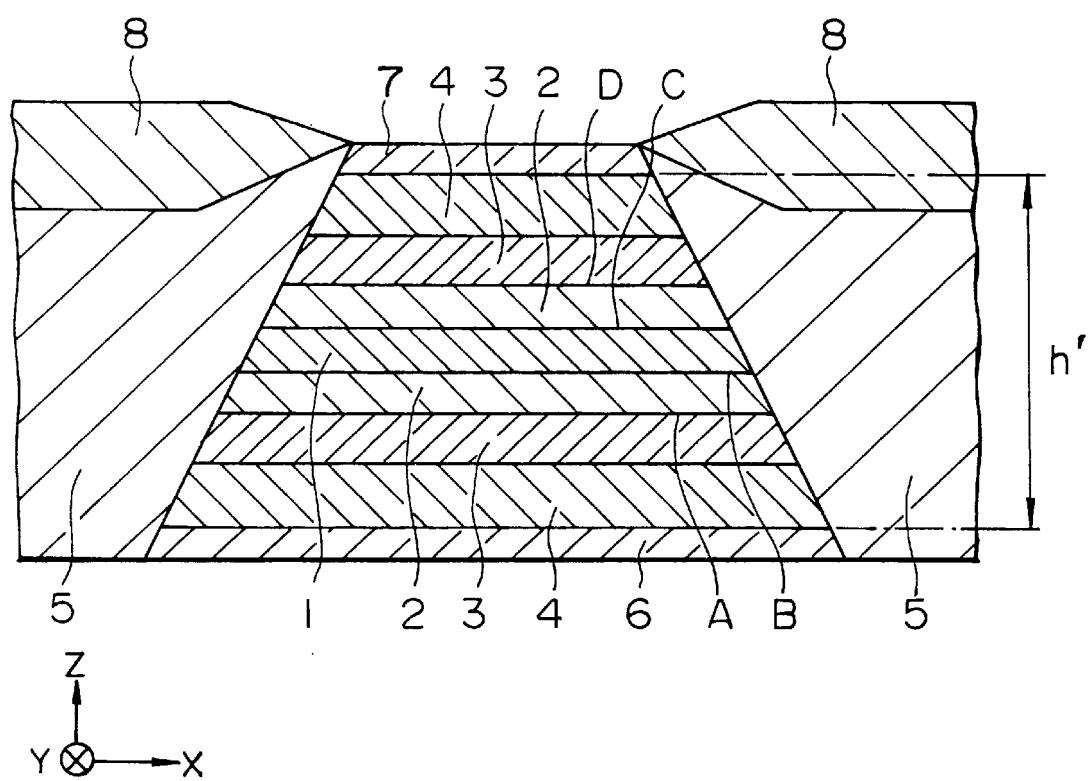
FIG. 14 is a sectional view of a conventional dual spin-valve type magnetoresistive sensor.

As shown in FIG. 14, electron scattering occurs in the dual spin-valve type magnetoresistive sensor at four places in total, i.e., the two boundary surfaces B and C between the free magnetic layer 1 and the non-magnetic electrically conductive layers 2 and the two boundary surfaces A and D between the pinned magnetic layers 3 and the non-magnetic electrically conductive layers 2. On the other hand, as shown in FIG. 13, electron scattering occurs in the single spin-valve type magnetoresistive sensor only at two places, i.e., the boundary surfaces A and B. It is however thought that a magnitude of the electron scattering occurred at the boundary surface B in the dual spin-valve type magnetoresistive sensor is smaller than that occurred at the boundary surface B in the single spin-valve type magnetoresistive sensor. This is because, in the dual spin-valve type magnetoresistive sensor, the single free magnetic layer 1 takes part in electron scattering at both the boundary surfaces B and C. Therefore, the magnetoresistance ratio of the dual spin-valve type magnetoresistive sensor is expected to be somewhat greater than that of the single spin-valve type magnetoresistive sensor.

Next, by supplying a steady electric current Is of 5 mA to the dual spin-valve type magnetoresistive sensor and the single spin-valve type magnetoresistive sensor each having a sensor width (track width Tw) of 2.2 μm and a sensor length (MR height "h") of 1.5 μm, and applying an external magnetic field to each sensor in the Y-direction, a voltage change (in proportion to a resistance change) was measured from the steady electric current Is while changing the external magnetic field.

Figure 2:
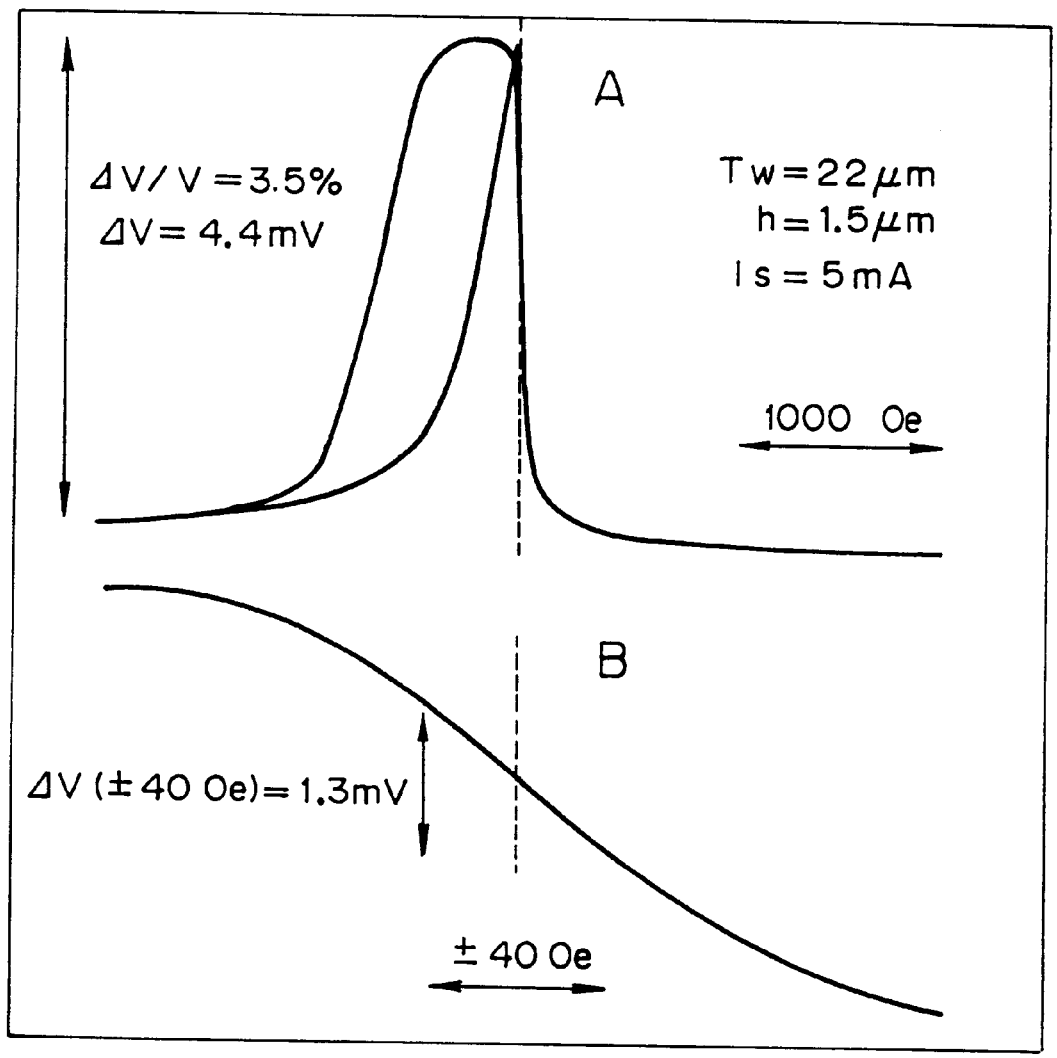
FIG. 2 is a graph showing the relationship between an external magnetic field and a magnetoresistance ratio in a dual spin-valve type magnetoresistive sensor in which a curve A indicates a major loop and a curve B indicates a minor loop.

FIG. 2 is a graph showing measured results, in which the horizontal axis represents the external magnetic field and the vertical axis represents the voltage change ΔV based on the steady electric current supplied to the dual spin-valve type magnetoresistive sensor. In the graph of FIG. 2, a curve A indicates a major loop representing the voltage change with respect to the external magnetic field in the range of ±2 KOe along the horizontal axis, and a curve B indicates a minor loop representing the voltage change with respect to the external magnetic field in the range of ±200 Oe along the horizontal axis.

As seen from the major loop A in FIG. 2, the voltage change in the dual spin-valve type magnetoresistive sensor is 4.4 mV and the magnetoresistance ratio is 3.5%. Also, the major loop draws a smooth curve free from step-like changes. This means that the two pinned magnetic layers 3, 3 are put into a single domain state under exchange anisotropic magnetic fields which are substantially the same in magnitude, and have coercive forces substantially equal to each other.

Further, it is seen that the minor loop B has no hysteresis and even when the external magnetic field is returned to 0 Oe, the coercive force of the free magnetic layer is substantially zero. In other words, this means that the free magnetic layer 1 is put into a single domain state in the X-direction by the presence of the hard bias layers 5 and hence Barkhausen noise can be reduced.

Figure 3:
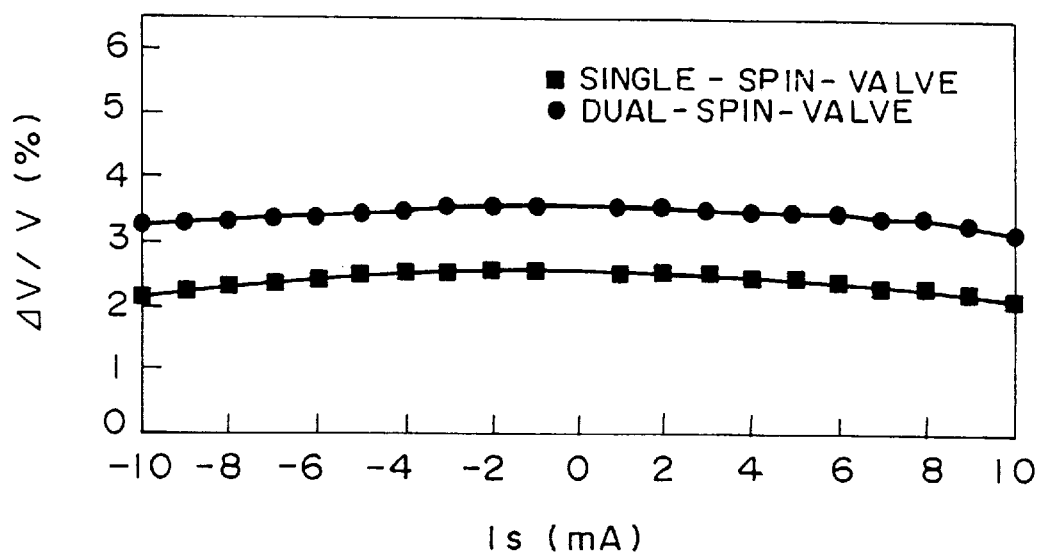
FIG. 3 is a graph showing the relationship between a steady electric current and a magnetoresistance ratio in the single spin-valve type magnetoresistive sensor and the dual spin-valve type magnetoresistive sensor.

FIG. 3 is a graph showing results of measuring variations in voltage change ratio (magnetoresistance ratio) ΔV/V for both the single spin-valve type magnetoresistive sensor and the dual spin-valve type magnetoresistive sensor, when the steady electric current Is was changed in the range of ±10 mA.

The steady electric current is assumed in the single spin-valve type magnetoresistive sensor to be positive when it generates a magnetic field in a direction to weaken the exchange anisotropic magnetic field produced by the pinned magnetic layer.

As seen from FIG. 3, despite of changes in steady electric current, the magnetoresistance ratio of the dual spin-valve type magnetoresistive sensor is always larger than that of the single spin-valve type magnetoresistive sensor. Furthermore, the magnetoresistance ratio ΔV/V at the steady electric current of 10 mA is dropped 8.8% from the ratio ΔV/V at 1 mA in the dual spin-valve type magnetoresistive sensor, while it is dropped 16.2% in the single spin-valve type magnetoresistive sensor. Thus, it is found from FIG. 3 that the magnetoresistance ratio in the dual spin-valve type magnetoresistive sensor of the present invention is stable with respect to changes in steady electric current.

Figure 4:
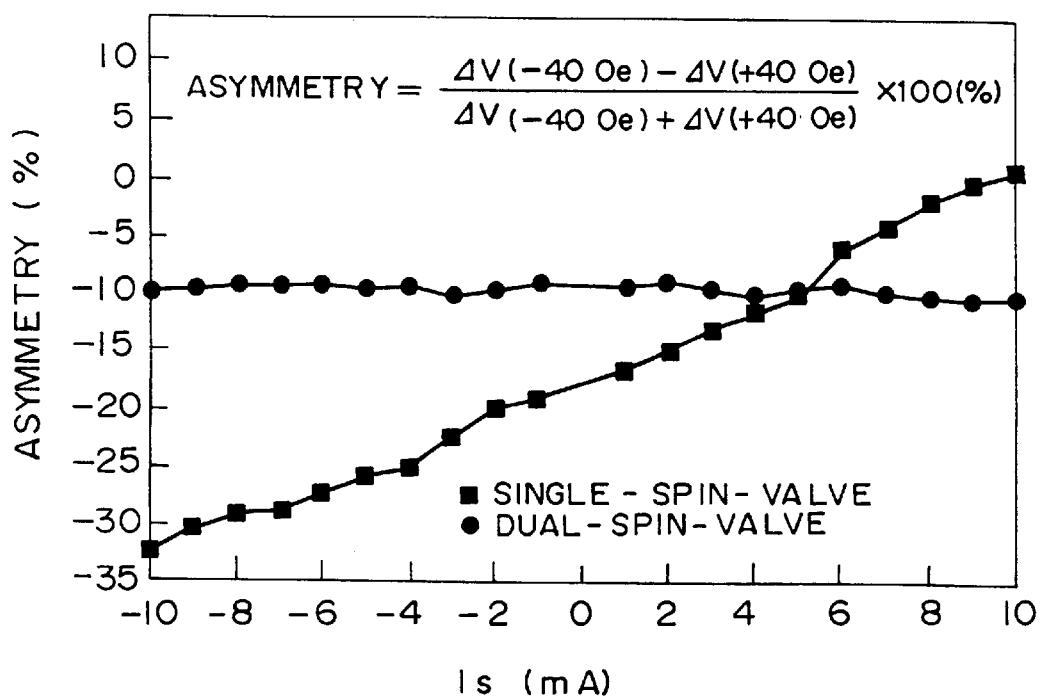
FIG. 4 is a graph showing the relationship between a steady electric current and asymmetry in the single spin-valve type magnetoresistive sensor and the dual spin-valve type magnetoresistive sensor.

FIG. 4 is a graph showing the relationship between changes in steady electric current and asymmetry.

Results shown in FIG. 4 were obtained from the minor loop in FIG. 2 to examine a degree of symmetry of the voltage change (resistance change) in the range of ±40 Oe corresponding to the magnitude of a leakage magnetic field from a magnetic recording medium such as a hard disk.

The horizontal axis represents changes in steady electric current, and the vertical axis represents percentages of asymmetry in both the dual spin-valve type magnetoresistive sensor and the single spin-valve type magnetoresistive sensor in terms of {(ΔV(-40 Oe)-ΔV(+40 Oe))/(ΔV(-40 Oe)+ΔV(+40 Oe))}×100.

As seen from FIG. 4, the asymmetry of the dual spin-valve type magnetoresistive sensor is about -10% and hardly dependent on the steady electric current. On the contrary, it is also seen that the asymmetry of the single spin-valve type magnetoresistive sensor changes from about -32% to +1% and remarkably dependent on the steady electric current.

This is because the multilayered film structure of the dual spin-valve type magnetoresistive sensor is symmetrical in the vertical direction and steady current-dependent magnetic fields produced by the steady electric currents flowing above and below the free magnetic layer cancel each other in the free magnetic layer so that the free magnetic layer is subject to no action from the steady current-dependent magnetic fields.

As described above, the dual spin-valve type magnetoresistive sensor using a PtMn alloy as material of the antiferromagnetic layer 4 can provide a larger magnetoresistance ratio when the external magnetic field is applied, and the magnetoresistance ratio includes no hysteresis and is less affected by changes in steady electric current. Accordingly, a dual spin-valve type magnetoresistive head using the above sensor, in which the antiferromagnetic layer is made of a PtMn alloy, can provide better characteristics.

Figure 5:
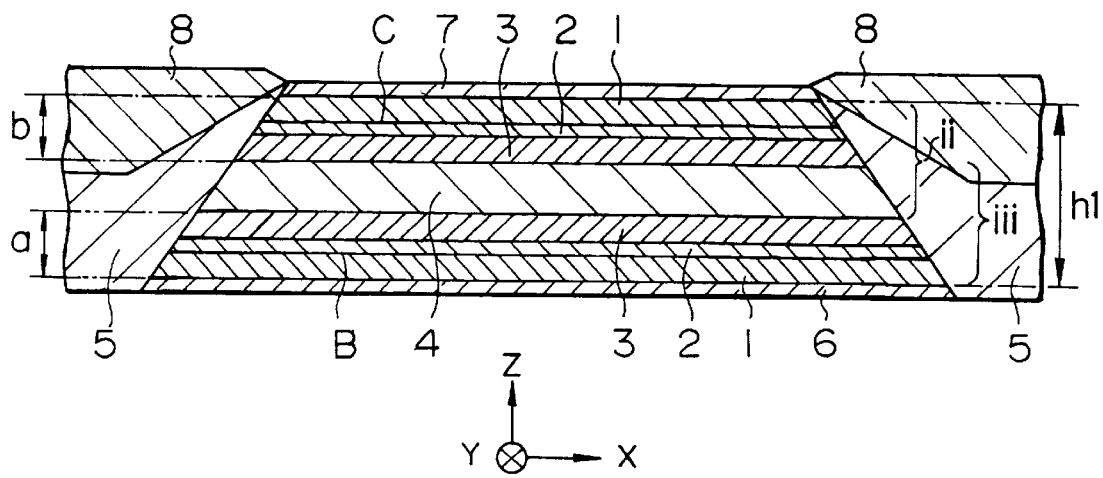
FIG. 5 is a sectional view of a spin-valve type magnetoresistive sensor according to a second embodiment of the present invention.

FIG. 5 is a sectional view showing the structure of a spin-valve type magnetoresistive sensor according to a second embodiment of the present invention.

The illustrated magnetoresistive sensor is attached to, for example, a trailing side end of a floating slider provided in a hard disk unit. In FIG. 5, a magnetic recording medium such as a hard disk is moved in the Z-direction and a leakage magnetic field from the magnetic recording medium is generated in the Y-direction.

Formed at the bottom in FIG. 5 is a buffer layer 6 made of non-magnetic material such as Ta (tantalum). Over the buffer layer 6, there is formed a spin-valve film laminate comprising seven layers. Numeral 7 denotes a barrier layer made of Ta.

The spin-valve film laminate is constructed by, from the bottom, successively forming a free magnetic layer 1 made of a FeNi (iron-nickel) alloy, a non-magnetic electrically conductive layer 2 made of Cu (copper) or the like, a pinned magnetic layer 3 made of a FeNi alloy and an antiferromagnetic layer 4 made of a PtMn (platinum-manganese) alloy, followed by successively forming thereon a separate pinned magnetic layer 3, a separate non-magnetic electrically conductive layer 2 and a separate free magnetic layer 1.

Assuming that a three-layer laminate constructed by successively forming the non-magnetic electrically conductive layer 2 and the pinned magnetic layer 3 over the free magnetic layer 1 will be referred to as a first film laminate "a" and a three-layer laminate constructed by successively forming the non-magnetic electrically conductive layer 2 and the free magnetic layer 1 over the pinned magnetic layer 3 will be referred to as a second film laminate "b", the spin-valve type magnetoresistive sensor of this embodiment has such a structure that the second film laminate "b" is formed over the first film laminate "a" with the antiferromagnetic layer 4 shared by both the film laminates.

For constructing a spin-valve type magnetoresistive head for practical use, a lower gap layer (not shown) made of non-magnetic layer is formed over a lower shielding layer (not shown) made of magnetic material having high permeability, and the layers shown in FIG. 5 are formed over the lower gap layer. Further, over the resulting laminate, an upper gap layer (not shown) made of non-magnetic layer and an upper shielding layer (not shown) made of magnetic material having high permeability are formed. A magnetic gap length is determined by the spacing between the lower shielding layer and the upper shielding layer.

After lamination of the antiferromagnetic layer 4 and the pinned magnetic layers 3, by heat-treating (annealing) the laminate under a magnetic field in the Y-direction, an exchange anisotropic magnetic field is produced at the boundary surface between the two adjacent layers, and the pinned magnetic layers 3 are put into a single domain state to have the magnetization direction fixed in the Y-direction.

Incidentally, the pinned magnetic layer 3 may be made of Co (cobalt), a Fe—Co (iron-cobalt) alloy, or a Fe—Co—Ni (iron-cobalt-nickel) alloy.

After the multilayer films from the buffer layer 6 to the barrier layer 7 have been all formed by sputtering and etched into a predetermined sectional shape, hard bias layers 5 for applying a longitudinal bias magnetic field in the X-direction to the free magnetic field 1 are formed. The hard bias layers 5 are magnetized in the X-direction and the magnetization direction of the free magnetic layer 1 is uniformly set in the X-direction under a magnetic field produced by the hard bias layers 5. The provision of the hard bias layers 5 is effective in suppressing the occurrence of Barkhausen noise. Further, electrically conductive layers 8, 8 made of W (tungsten) or Cu (Copper), for example, are formed respectively on the hard bias layers 5, 5.

In the spin-valve type magnetoresistive sensor formed as described above, when a steady electric current (sensing electric current) is applied to the free magnetic layer 1, the non-magnetic electrically conductive layers 2 and the pinned magnetic layers 3 from the electrically conductive layers 8, and simultaneously a magnetic field is applied from a magnetic recording medium in the Y-direction, the magnetization direction of the free magnetic layer 1 is varied from the X-direction to the Y-direction. At this time, electrons tending to move from the free magnetic layer 1 to the pinned magnetic layer 3 or vice versa are scattered at the boundary surface between the non-magnetic electrically conductive layer 2 and the free magnetic layer 1 or at the boundary surface between the non-magnetic electrically conductive layer 2 and the pinned magnetic layer 3, thereby causing a change in electrical resistance. As a result, the steady electric current is changed and a detection output of the magnetic field applied from the magnetic recording medium is produced.

As mentioned above, the spin-valve film laminate shown in FIG. 5 comprises seven layers, i.e., the same number of layers as the total number of layers making up the film laminate of the dual spin-valve type magnetoresistive sensor. But the 7-layer spin-valve film laminate shown in FIG. 5 has a total thickness h1 smaller than the total thickness h' of the 7-layer spin-valve film laminate shown in FIG. 1. The reason is that the antiferromagnetic layer 4 having a larger film thickness than the free magnetic layer 1, the non-magnetic electrically conductive layer 2 and the pinned magnetic layer 3 is formed two in FIG. 1, but only one in FIG. 5. The smaller total thickness h1 contributes to reducing the magnetic gap length.

Also, since the spin-valve film laminate shown in FIG. 5 has such a structure that one single type spin-valve film laminate "i" is formed on the other single type spin-valve film laminate "ii" with the antiferromagnetic layer 4 shared by both the film laminates, the magnetoresistance ratio and the reproduction output of the spin-valve type magnetoresistive sensor shown in FIG. 5 are much larger than the magnetoresistance ratio (3–9%) and the reproduction output of the single spin-valve type magnetoresistive sensor. It is further expected that the magnetoresistance ratio and the reproduction output of the spin-valve type magnetoresistive sensor shown in FIG. 5 are larger than the magnetoresistance ratio (5–13%) and the reproduction output of the dual spin-valve type magnetoresistive sensor shown in FIG. 1.

In the spin-valve film laminate shown in FIG. 5, the two free magnetic layers 1 are provided such that each free magnetic layer 1 forms the boundary surfaces B, C between itself and the non-magnetic electrically conductive layer 2. On the other hand, in the spin-valve film laminate shown in FIG. 1, the single free magnetic layers 1 forms the boundary surfaces B, C between itself and the non-magnetic electrically conductive layer 2, and takes part in electron scattering occurred at both the boundary surfaces B, C. Therefore, the magnitude of electron scattering occurred at the boundary surfaces B, C in FIG. 5 is larger than that occurred at the boundary surfaces B, C in FIG. 1. It is thus concluded that the spin-valve type magnetoresistive sensor shown in FIG. 5 has a larger magnetoresistance ratio than the dual spin-valve type magnetoresistive sensor shown in FIG. 1.

From calculation of plane recording density based on the maximum magnetoresistance ratio and an upper limit value of the steady electric current, it has been confirmed that the plane recording density of the spin-valve type magnetoresistive sensor shown in FIG. 5 is expected to be 20 Cb/in² or more.

Figure 6:
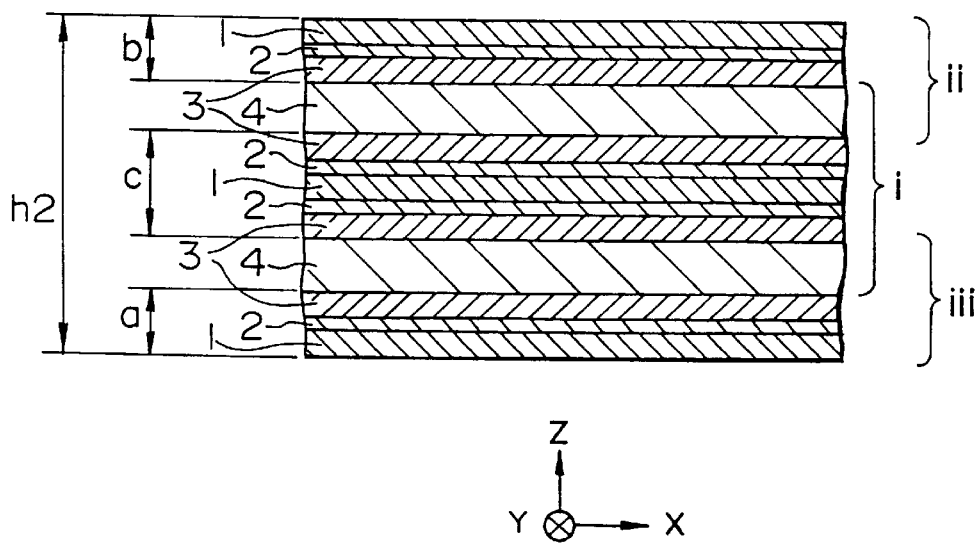
FIG. 6 is a front view of a spin-valve film laminate according to a third embodiment of the present invention.

FIG. 6 is a front view showing the structure of a spin-valve film laminate according to a third embodiment of the present invention. Note that FIG. 6 shows the spin-valve film laminate immediately after forming multilayer films, and the laminate is then etched to a predetermined shape, followed by formation of hard bias layers (5 in FIG. 5) and the electrically conductive layers (8 in FIG. 5), as explained above in connection with FIG. 5. Further, a buffer layer (6 in FIG. 5) and a barrier layer (7 in FIG. 5) are also omitted in FIG. 6.

The spin-valve film laminate shown in FIG. 6 comprises thirteen layers. The film laminate includes a first film laminate "a" at the top and a second film laminate "b" at the bottom, the laminates "a" and "b" being the same as those shown in FIG. 5. The film laminate also includes a third film laminate "c" of 5-layer structure made by, from the bottom, successively forming a pinned magnetic layer 3, a non-magnetic electrically conductive layer 2, a free magnetic layer 1, a separate non-magnetic electrically conductive layer 2, and a separate pinned magnetic layer 3. Then, the third film laminate "c" is formed over the first film laminate "a" with an antiferromagnetic layer 4 shared by both the film laminates, and the second film laminate "b" is formed over the third film laminate "c" with a separate antiferromagnetic layer 4 shared by both the film laminates.

The pinned magnetic layers 3 of the film laminates "a", "b" and "c" are each formed adjacent to an upper or lower surface of the antiferromagnetic layer 4 so that the pinned magnetic layer 3 is magnetized into a single domain state in the Y-direction under an exchange anisotropic magnetic field produced by exchange coupling at the boundary surface between the pinned magnetic layer 3 and the antiferromagnetic layer 4. Further, under a bias magnetic field produced by the hard bias layers 5, the free magnetic layer 1 is uniformly magnetized in the X-direction crossing the magnetization direction of the pinned magnetic layer 3.

A PtMn alloy is used as antiferromagnetic material to form the antiferromagnetic layer 4. By employing a PtMn alloy film as the antiferromagnetic layer 4, a sufficient exchange anisotropic magnetic field can be produced even with heat treatment (annealing) carried at a temperature not higher than 230° C. after forming the films, and an exchange anisotropic magnetic field on the order of 300 Oe can be produced even with the antiferromagnetic layer 4 having a film thickness of about 100 angstroms. Because the film thickness of the antiferromagnetic layer 4 can be set to about 100 angstroms, a total thickness h2 of the spin-valve film laminate is not significantly increased. Note that the antiferromagnetic layer 4 shown in FIG. 5 is also preferably formed of a PtMn alloy film and the use of such antiferromagnetic material likewise contributes to reducing the total thickness h1 of the spin-valve film laminate shown in FIG. 5.

The spin-valve film laminate of FIG. 6 has such a structure that a dual type spin-valve film laminate "i" is formed over one single type spin-valve film laminate "iii" with one antiferromagnetic layer 4 shared by both the film laminates, and the other single type spin-valve film laminate "ii" is formed over the dual type spin-valve film laminate "i" with the other antiferromagnetic layer 4 shared by both the film laminates.

In other words, the boundary surface between the free magnetic layer 1 and the non-magnetic electrically conductive layer 2 and the boundary surface between the pinned magnetic layer 3 and the non-magnetic electrically conductive layer 2 are each present four in number. Hence, electron scattering occurs at eight places in total.

It is therefore expected that the magnetoresistance ratio and the reproduction output of the spin-valve type magnetoresistive sensor using the spin-valve film laminate shown in FIG. 6 are about four times those of the conventional single spin-valve type magnetoresistive sensor, and are about two times those of the dual spin-valve type magnetoresistive sensor. From calculation of plane recording density based on the maximum magnetoresistance ratio and an upper limit value of the steady electric current, it has been confirmed that the plane recording density of a spin-valve type magnetoresistive sensor using the spin-valve film laminate shown in FIG. 6 is expected to be 50 Gb/in² at maximum.

Figure 7:
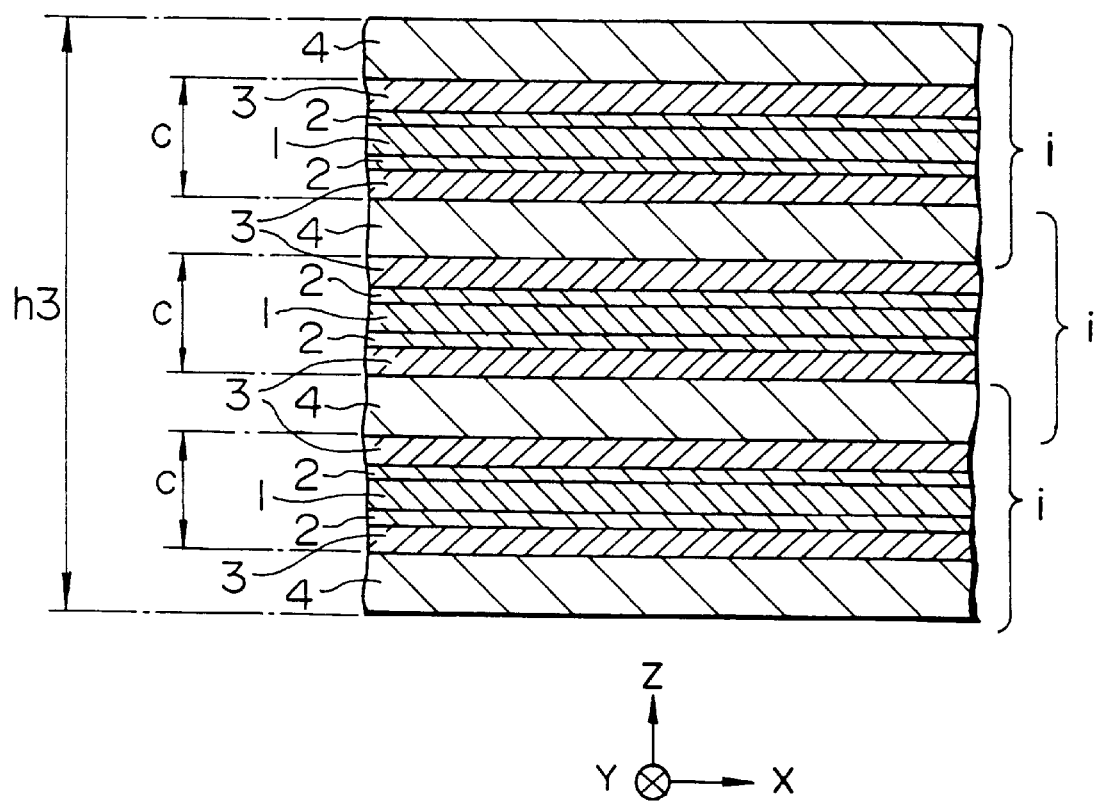
FIG. 7 is a front view of a spin-valve film laminate according to a fourth embodiment of the present invention.

FIG. 7 is a front view showing the structure of a spin-valve film laminate according to a fourth embodiment of the present invention. Note that FIG. 7 shows the spin-valve film laminate immediately after forming multilayer films, and the laminate is then etched to a predetermined shape, followed by formation of hard bias layers (5 in FIG. 5) and the electrically conductive layers (8 in FIG. 5), as explained above in connection with FIG. 5. Further, a buffer layer (6 in FIG. 5) and a barrier layer (7 in FIG. 5) are also omitted in FIG. 7.

The spin-valve film laminate shown in FIG. 7 is constructed by forming in three stages the third film laminate "c" of 5-layer structure explained above in connection with FIG. 6. An antiferromagnetic layer 4 is interposed between the two film laminates "c", and other antiferromagnetic layers 4 are formed respectively on upper and lower surfaces of the pinned magnetic layers 3 of the upper and lower film laminates. As a whole, the antiferromagnetic layer 4 is formed four times and the film laminate "c" is successively stacked in three stages.

The antiferromagnetic layer 4 is made of a PtMn alloy in a film thickness of about 100 angstroms. Therefore, a total thickness h3 of the spin-valve film laminate is not significantly increased.

The spin-valve film laminate of FIG. 7 has such a structure that a second dual type spin-valve film laminate "i" is formed over a first dual type spin-valve film laminate "i" with one antiferromagnetic layer 4 shared by both the film laminates, and a third dual type spin-valve film laminate "i" is formed over the second type spin-valve film laminate "i" with another antiferromagnetic layer 4 shared by both the film laminates. Thus, three dual type spin-valve film laminates "i" are successively stacked one over another.

Accordingly, the boundary surface between the free magnetic layer 1 and the non-magnetic electrically conductive layer 2 and the boundary surface between the pinned magnetic layer 3 and the non-magnetic electrically conductive layer 2 are each present six in number. Hence, electron scattering occurs at twelve places in total. As a result, the magnetoresistance ratio and the reproduction output of a spin-valve type magnetoresistive sensor using the spin-valve film laminate shown in FIG. 7 are substantially higher than those of both the conventional single and dual spin-valve type magnetoresistive sensors.

The magnetoresistance ratio of the spin-valve type magnetoresistive sensor using the spin-valve film laminate shown in FIG. 7 is lower than that of the multilayer type GMR sensor, but an external magnetic field on the order of several thousands Oe is required to achieve a high magnetoresistance ratio in the multilayer type GMR sensor. On the other hand, a relatively high magnetoresistance ratio can be achieved with a very weak external magnetic field in the spin-valve type magnetoresistive sensor using the spin-valve film laminate shown in FIG. 7.

The reason why a relatively high magnetoresistance ratio can be achieved with a very weak external magnetic field is that magnetization of the free magnetic layer 1 is not so firmly fixed that the magnetization direction of the free magnetic layer 1 is varied even with a very weak external magnetic field. A value of electrical resistance is changed depending on the relationship between a variation in the magnetization direction of the free magnetic layer 1 and the fixed magnetization direction of the pinned magnetic layer 3. Based on a voltage change resulted from a change in value of electrical resistance, a leakage magnetic field from the magnetic recording medium is detected.

Further, it is impossible in the multilayer type GMR sensor to provide hard bias layers. By contrast, it is possible in the spin-valve film laminate shown in FIG. 7 to provide hard bias layers and reduce the occurrence of Barkhausen noise.

In the present invention, one or more dual type spin-valve film laminates "i" may be further formed over the spin-valve film laminate shown in FIG. 7 to improve the magnetoresistance ratio and the reproduction output.

But, the total thickness h3 of the spin-valve film laminate has an upper limit value that is defined by the preset spacing between a lower shielding layer (not shown) and an upper shielding layer (not shown). Therefore, by stacking the dual type spin-valve film laminate "i" over the spin-valve film laminate shown in FIG. 7 until reaching the upper limit value of the spacing between the lower shielding layer and the upper shielding layer, the magnetoresistance ratio and the reproduction output of the spin-valve type magnetoresistive sensor can be further improved.

From calculation of plane recording density based on the maximum magnetoresistance ratio and an upper limit value of the steady electric current, it has been found that the plane recording density of the spin-valve type magnetoresistive sensor using the spin-valve film laminate shown in FIG. 7 is expected to be in the range of 50 Gb/in$^2$ to 100 Gb/in$^2$ comparable to the plane recording density of the multilayer type GMR sensor.

Exchange coupling between antiferromagnetic materials employed to form the antiferromagnetic layer 4 and ferromagnetic materials employed to form the pinned magnetic layer 3 will be described below with reference to several examples.

First, film laminates having structures explained below were formed on a silicon (Si)/aluminum oxide ($Al_2O_3$) substrate by the DC magnetron sputtering method and the RF conventional sputtering method.

The following two film laminates were formed by using, as the antiferromagnetic layer, a PtMn film with compositional proportions of 50 at % Pt and 50 at % Mn:

(1) five kinds of film laminates consisting of, from the bottom, Ta/Co (30 angstroms)/PtMn (X)/Ta in the order named, wherein a film thickness X of the PtMn film is one of 100, 150, 200, 300 and 500 angstroms; and (2) five kinds of film laminates consisting of, from the bottom, Ta/PtMn (X)/Co (30 angstroms)/Ta in the order named, wherein a film thickness X of the PtMn film is one of 100, 150, 200, 300 and 500 angstroms.

Also, the following two film laminates were formed by using, as the antiferromagnetic layer, a NiMn film with compositional proportions of 50 at % Ni and 50 at % Mn:

(3) five kinds of film laminates consisting of, from the bottom, Ta/Co (30 angstroms)/NiMn (X)/Ta in the order named, wherein a film thickness X of the NiMn film is one of 100, 150, 200, 300 and 500 angstroms; and (4) five kinds of film laminates consisting of, from the bottom, Ta/NiMn (X)/Co (30 angstroms)/Ta in the order named, wherein a film thickness X of the NiMn film is one of 100, 150, 200, 300 and 500 angstroms.

Then, the above film laminates were each subject to heat treatment (annealing) at a temperature of 230° C. for 4 hours to develop exchange coupling between the film of antiferromagnetic material and the film of Co, i.e., of ferromagnetic material. An exchange anisotropic magnetic field (Hex) was measured by using a VSM equipped with an evacuating/heating mechanism.

The PtMn film and the NiMn film used to form the antiferromagnetic films had each a specific resistance value of about 200 $\mu\Omega$·cm.

Figure 8:
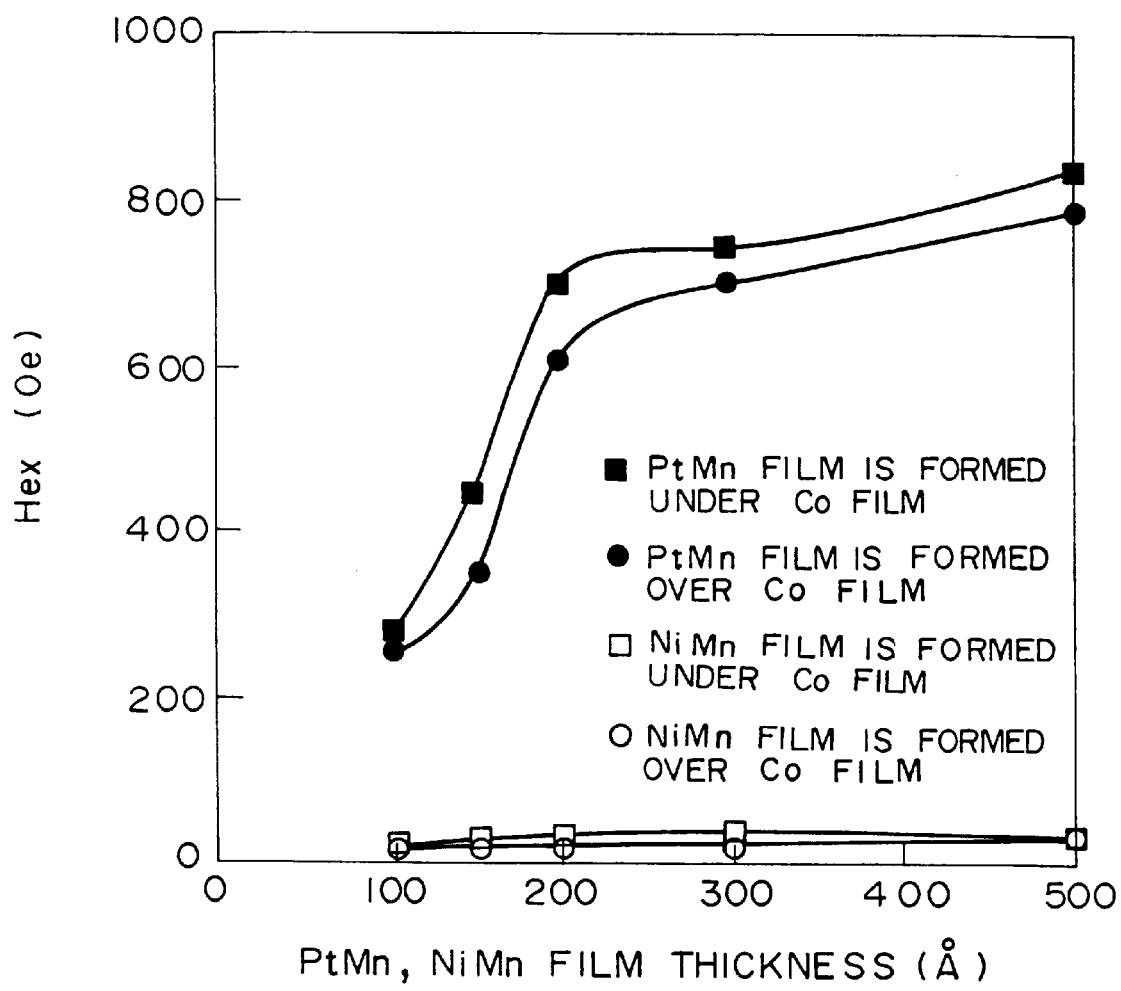
FIG. 8 is a graph showing the relationship between a thickness of a PtMn film or a thickness of a NiMn film and an exchange anisotropic magnetic field.

FIG. 8 is a graph showing the relationship between a thickness of the PtMn film or the NiMn film and an exchange anisotropic magnetic field (Hex).

As seen from FIG. 8, as the thickness of the PtMn film increases, the exchange anisotropic magnetic field (Hex) also increases. Further, the laminate having the PtMn film formed under the Co film shows a somewhat stronger exchange anisotropic magnetic field than the laminate having the PtMn film formed over the Co film.

It has also been confirmed that even with the PtMn film having a thickness on the order of 100 angstroms, a relatively stronger exchange anisotropic magnetic field of about 300 Oe is produced.

By contrast, it is seen that, in the film laminates using the NiMn films, even though the film thickness is increased, the exchange anisotropic magnetic field (Hex) remains very small, and hence that the NiMn films cannot be practically used if the heat treatment is performed at a temperature of 230° C.

For the film laminates using the NiMn films, it has been confirmed that if the heat treatment temperature is not lower than 250° C., the film laminates show similar characteristics as indicated by curves of the PtMn films shown in FIG. 8. However, the heat treatment temperature of above 250° C. causes a problem that metallic elements and electrons are diffused at the boundary surfaces of the non-magnetic electrically conductive layer 2 adjacent to the pinned magnetic layer 3 and the free magnetic layer 1. For this reason, the heat treatment temperature is required to be kept at about 230° C.

While the above experiment employed the Co films as the pinned magnetic layer 3, similar results as obtained by the above experiment are provided when FeNi films are used instead of the Co films.

As will be seen from the above, by using a PtMn film as the antiferromagnetic layer, a sufficient exchange anisotropic magnetic field can be produced even with the heat treatment temperature of about 230° C. In particular, even with the PtMn film having a thickness on the order of 100 angstroms, an exchange anisotropic magnetic field of about 300 Oe is produced.

Results of experiments made on exchange coupling between the PtMn alloy constituting the antiferromagnetic layer 4 and the ferromagnetic material constituting the pinned magnetic layer 3 will be described below.

First, a film of aluminum oxide was formed on the surface of a silicon (Si) substrate by the DC magnetron sputtering method and the RF conventional sputtering method. Subsequently, over the film of aluminum oxide, films of Ta (3 nm)/FeNi (5 nm)/PtMn (20 nm)/Ta (5 nm) were successively formed in the order named from the bottom. After that, a resulting laminate was covered by a film of aluminum oxide. Note that ( ) represents a film thickness.

The PtMn film was formed by using both a composite target including a Pt chip placed on a Mn target and an alloy target so that the composition of the PtMn film was able to be varied during the film forming process. While the composition of the PtMn film was varied for each of the film laminates, the same PtMn film was separately deposited on the Si substrate in a thickness of 1 μm, enabling the composition of the PtMn film to be analyzed by an XMA (X-ray microanalyzer).

Then, the film laminates were each subject to heat treatment (annealing) at a temperature of 270° C. under a magnetic field of 2000 Oe at a vacuum degree of $5\times10^{-6}$ Torr or less to develop exchange coupling between the PtMn alloy as antiferromagnetic material and the FeNi alloy as ferromagnetic material. An exchange anisotropic magnetic field (Hex) was measured by using a VSM equipped with an evacuating/heating mechanism.

Figure 9:
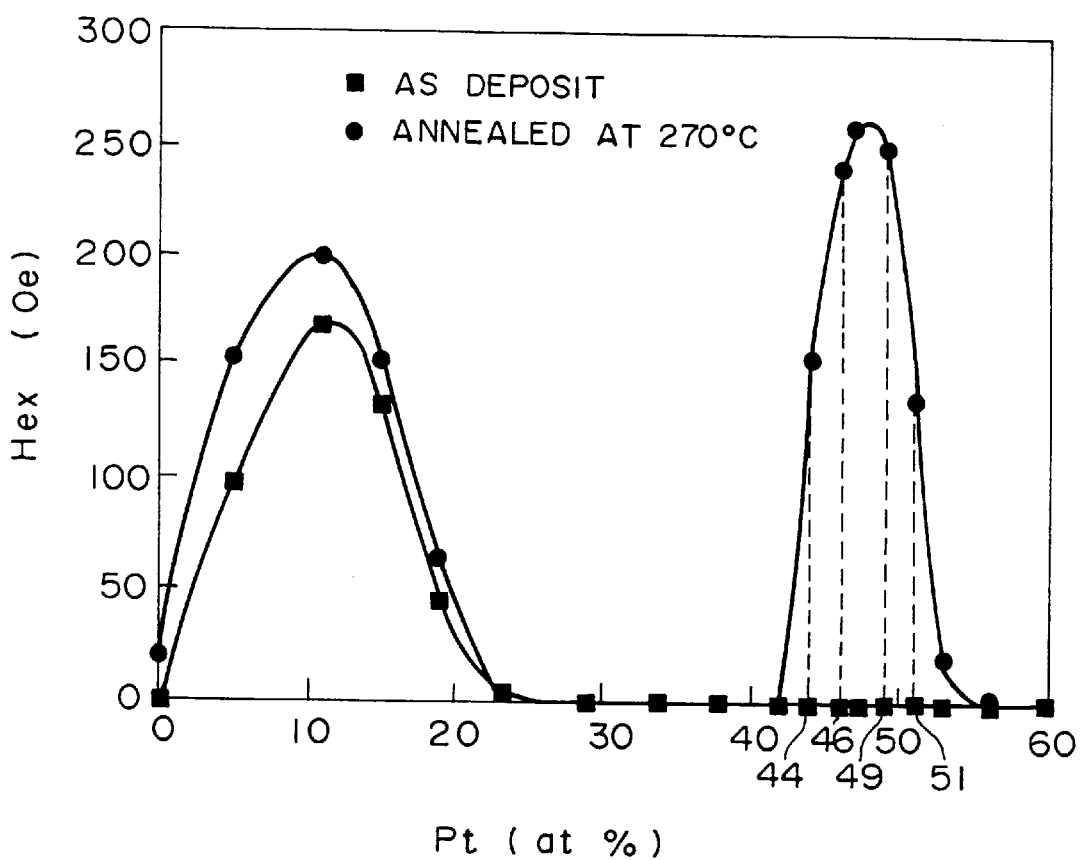
FIG. 9 is a graph showing the relationship between a composition of a PtMn film and an exchange anisotropic magnetic field.

FIG. 9 is a graph showing values of the exchange anisotropic magnetic field (Hex) measured immediately after forming the film laminate (indicated by "as deposit" and after heat-treating (annealing) the film laminate at 270° C. as explained above, when the composition of the PtMn film was changed with Pt ranging from 0 to 60 at %.

As seen from FIG. 9, in both the cases of the film laminate being subject to the heat treatment and not subject to the heat treatment, the Hex is produced when Pt is in the range of 0–25%. However, the exchange coupling on that condition is developed only when the PtMn film is formed over the FeNi film, but not developed when the PtMn film is formed under the FeNi film.

After the heat treatment, the exchange coupling is developed when Pt is in the range of 42–55 at %. On this condition, the exchange coupling is developed in both the cases where the PtMn film is formed over and under the FeNi film. Then, when Pt is in the range of 44–51 at %, the exchange anisotropic magnetic field (Hex) exceeds 130 Oe, and when Pt is in the range of 46–49 at %, the Hex exceeds 240 Oe.

Accordingly, it is preferable that, in the dual spin-valve type magnetoresistive sensor shown in FIG. 1, the exchange anisotropic magnetic field is produced by the heat treatment and the PtMn alloy constituting the antiferromagnetic layer has a composition consisted of Pt in the range of 44–51 at % and Mn in the range of 49–56 at %. More preferably, Pt ranges 46–49 at % and Mn ranges 51–54 at %.

Figure 10:
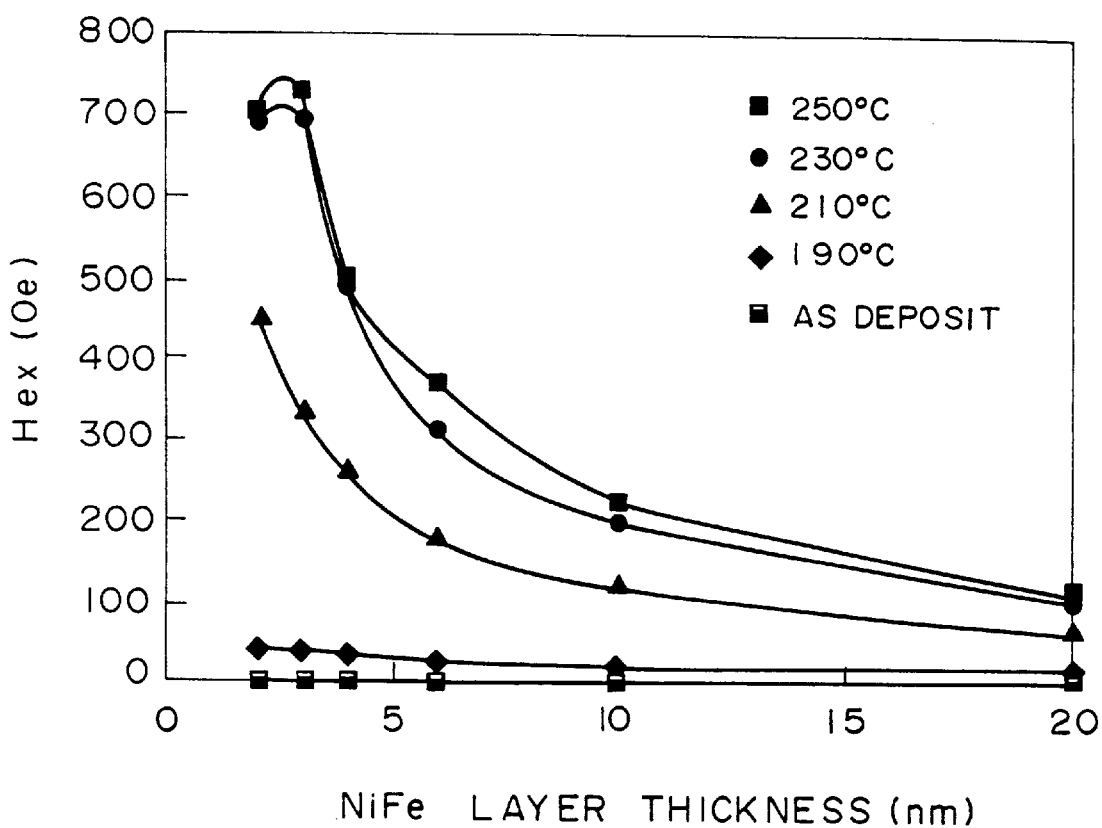
FIG. 10 is a graph showing the relationship between a heat treatment (annealing) temperature and a thickness of a pinned magnetic layer (FeNi film) versus an exchange anisotropic magnetic field.

FIG. 10 is a graph showing the relationship of exchange coupling developed between the PtMn film as antiferromagnetic material and the FeNi film constituting the pinned magnetic layer versus a heat treatment (annealing) temperature.

Film laminates were each prepared by forming a film of aluminum oxide on a silicon substrate and then forming films of Ta (3 nm)/PtMn (30 nm)/FeNi/Ta (5 nm)/aluminum oxide successively over the film of aluminum oxide in the order named. The films were deposited by the DC magnetron sputtering method using an alloy target. The PtMn film had a composition consisted of 48 at % Pt and 52 at % Mn.

The thickness of the FeNi film was set to one of five values, i.e., 2 nm, 3 nm, 4 nm, 10 nm and 20 nm.

Then, the film laminates were each subject to heat treatment (annealing) under a magnetic field of 2000 Oe at a vacuum degree of $5\times10^{-6}$ Torr or less to develop an exchange anisotropic magnetic field (Hex). The heat treatment in vacuum was carried out at temperatures of 0° C., 190° C., 210° C., 230° C. and 270° C.

The exchange anisotropic magnetic field (Hex) was measured by using a VSM for each of the film laminates annealed at the different temperatures. In the graph of FIG. 10, the horizontal axis represents changes in thickness of the FeNi film and the vertical axis represents the exchange anisotropic magnetic field (Hex).

As seen from FIG. 10, if the thickness of the FeNi film constituting the pinned magnetic layer is not larger than 5 nm, the exchange anisotropic magnetic field (Hex) over 200 Oe can be produced by the heat treatment at 210° C. Also, if the thickness of the FeNi film is not larger than 10 nm, the exchange anisotropic magnetic field (Hex) over 200 Oe can be produced at a relatively low heat treatment temperature of about 230° C.

Thus, by using a PtMn film as the antiferromagnetic layer 4, the exchange anisotropic magnetic field can be produced by the heat treatment at a relatively low temperature. This makes it possible prevent diffusion of metallic elements and electrons at the boundary surface between the Cu film constituting the non-magnetic electrically conductive layer and the NiFe film forming constituting the pinned magnetic layer or the free magnetic layer, that is a problem caused by the heat treatment at high temperatures. As a result, the spin-valve type magnetoresistive head can always have good characteristics.

Figure 11:
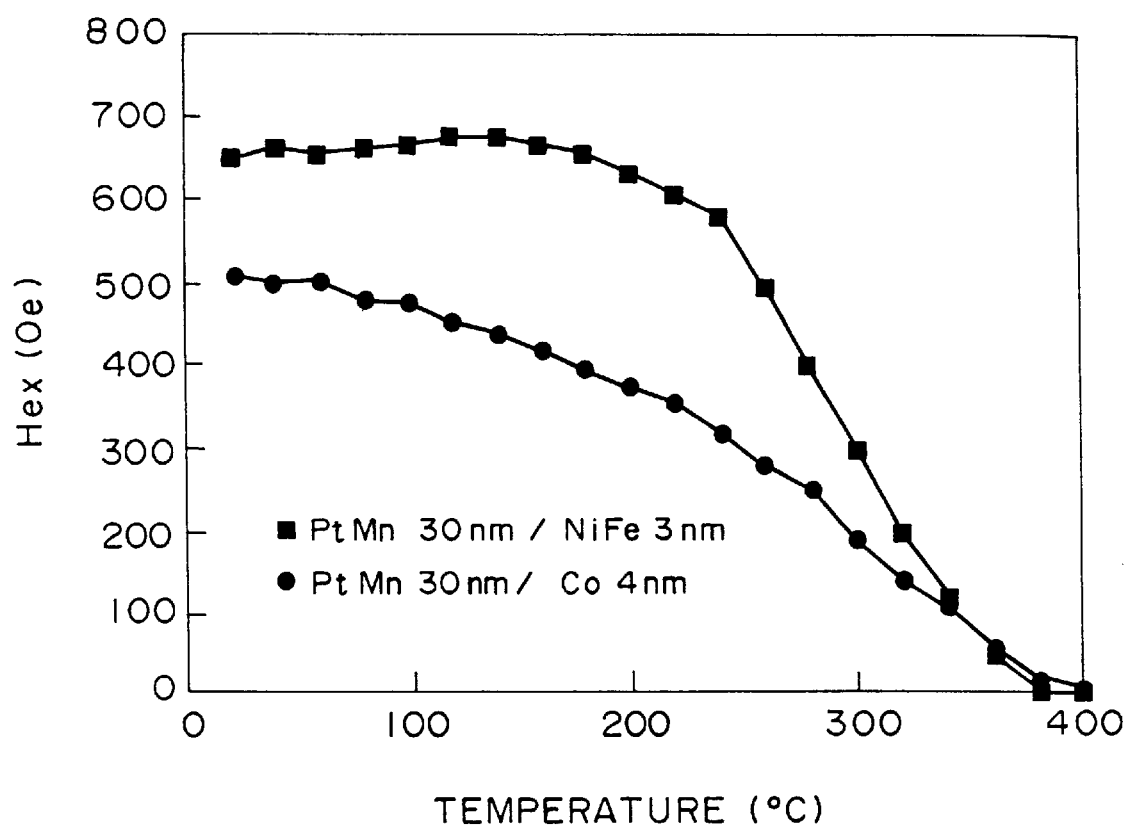
FIG. 11 is a graph showing the relationship between an ambient temperature and an exchange anisotropic magnetic field when the pinned magnetic layer is formed of a FeNi film or a Co film.
Figure 12:
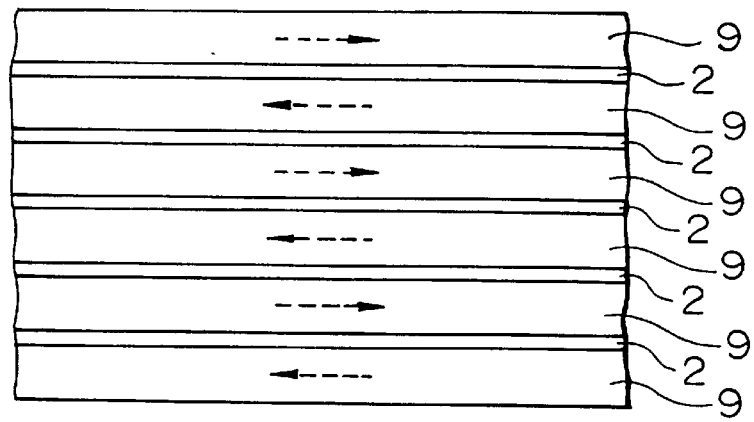
FIG. 12 is a sectional view of a conventional multilayer type GMR sensor.

FIG. 11 is a graph showing results of examining effects of operating ambient temperatures upon an exchange anisotropic magnetic field when ferromagnetic material of the pinned magnetic layer 3 is a FeNi alloy or Co.

Two kinds of film laminates were prepared by forming films of aluminum oxide/Ta (3 nm)/PtMn (30 nm)/FeNi (3 nm)/Ta (5 nm)/aluminum oxide successively over a silicon substrate in the order named, and by forming films of aluminum oxide/Ta (3 nm)/PtMn (30 nm)/Co (4 nm)/Ta (5 nm)/aluminum oxide successively over a silicon substrate in the order named.

The films were deposited by the DC magnetron sputtering method using an alloy target. The PtMn film had a composition consisted of 48 at % Pt and 52 at % Mn.

Then, the two kinds of film laminates were each subject to heat treatment (annealing) at 230° C. under a magnetic field of 2000 Oe at a vacuum degree of $5\times10^{-6}$ Torr or less to develop an exchange anisotropic magnetic field (Hex). After the heat treatment, the film laminates were cooled down to a room temperature.

After the cooling, the ambient temperature of the film laminates were raised and the exchange anisotropic magnetic field was measured at different temperatures.

In the graph of FIG. 11, the horizontal axis represents the ambient temperature and the vertical axis represents the exchange anisotropic magnetic field (Hex).

When the FeNi film was used as ferromagnetic material to form the pinned magnetic layer, the Hex is not appreciably lowered with the heat treatment temperature rising from a room temperature to about 200° C., starts declining from about 240° C., and disappears at about 380° C. (blocking temperature). When the Co film was used as ferromagnetic material to form the pinned magnetic layer, the Hex is not appreciably lowered in the range of a room temperature to about 120° C., starts gradually declining from about 120° C., and disappears at the blocking temperature of about 380° C. as with the case of using the FeNi film.

Thus, the temperature at which the Hex disappears (blocking temperature) is as very high as about 380° C. for both the cases of using the FeNi film and the Co film. Particularly, the Hex produced by both the FeNi film and the Co film is almost flat in the range of a room temperature to about 120° C. to which the temperature around the magnetoresistive films possibly rises in practical use. Therefore, a stable exchange anisotropic magnetic field can be always achieved.

According to the present invention, as described above in detail, by forming the antiferromagnetic layer using a PtMn alloy, or any of a PdMn alloy and a Pt—Mn—X (X=Ni, Pd, Rh, Ru, Ir, Cr, Fe, Co) alloy that have comparable properties to the PtMn alloy, a sufficient exchange anisotropic magnetic field can be achieved regardless of whether the antiferromagnetic layer is formed over or under the pinned magnetic layer. Further, an effective exchange anisotropic magnetic field can be achieved even with heat treatment at a relatively low temperature. Also, the PtMn alloy is highly thermally stable and has superior corrosion resistance. It is therefore possible to manufacture a dual spin-valve type magnetoresistive sensor and a dual spin-valve type magnetoresistive head having good characteristics required as a magnetoresistive head.

The dual spin-valve type magnetoresistive head wherein the antiferromagnetic layer is made of a PtMn alloy, a PdMn alloy or a Pt—Mn—X (X=Ni, Pd, Rh, Ru, Ir, Cr, Fe, Co) alloy has a higher magnetoresistance ratio and a much greater degree of asymmetry than the single spin-valve type magnetoresistive head.

Further, since the antiferromagnetic layer is made of a PtMn alloy, a PdMn alloy or a Pt—Mn—X (X=Ni, Pd, Rh, Ru, Ir, Cr, Fe, Co) alloy, the materials of the antiferromagnetic layers over and under the pinned magnetic layers can be used in common. It is therefore possible to reduce the number of sputtering targets used for forming the films and facilitate the manufacture process.

In addition, according to the present invention, by forming the antiferromagnetic layer using a PtMn alloy, or any of a PdMn alloy and a Pt—Mn—X (X=Ni, Pd, Rh, Ru, Ir, Cr, Fe, Co) alloy that have comparable properties to the PtMn alloy, an effective exchange anisotropic magnetic field can be achieved even with a relatively low heat treatment temperature and a relatively small film thickness.

While conventional single and dual spin-valve type magnetoresistive sensors and conventional multilayer type GMR sensors are improved in structure to increase the number of total layers of a spin-valve film laminate developing the giant magnetoresistive effect as compared with the conventional sensors, the use of a PtMn film as the antiferromagnetic layer makes it possible to reduce a total thickness of the spin-valve film laminate and hence realize a reduction in the magnetic gap length G1.

Also, by increasing the number of total layers of the spin-valve film laminate and hence the number of places where electron scattering occurs, the magnetoresistance ratio and the reproduction output can be increased, which results in improved plane recording density.

What is claimed is:

1. A method of manufacturing a magnetoresistive effect device, said method comprising:

forming a first antiferromagnetic layer made of a PtMn alloy on a substrate by a DC magnetron sputtering process, forming a first pinned magnetic layer on said first antiferromagnetic layer in direct contact by a DC magnetron sputtering process, forming a first non-magnetic electrically conductive layer on said first pinned magnetic layer, forming a free magnetic layer on said first non-magnetic electrically conductive layer, forming a second non-magnetic electrically conductive layer on said free magnetic layer, forming a second pinned magnetic layer on said second non-magnetic electrically conductive layer by a DC magnetron sputtering process, forming a second antiferromagnetic layer made of a PtMn alloy on said second pinned magnetic layer in direct contact by a DC magnetron sputtering process, and heat-treating said first antiferromagnetic layer, said first pinned magnetic layer, said second pinned magnetic layer, and said second antiferromagnetic layer in a magnetic field at a temperature of between 210° C. and 250° C.

2. The method of manufacturing a magnetoresistive effect device according to claim 1, wherein said PtMn alloy has a composition of Pt—Mn—X, and X represents at least one element selected from Ni, Pd, Rh, Ru, Ir, Cr, Fe and Co.

3. The method of manufacturing a magnetoresistive effect device according to claim 1, wherein said heat treatment is performed in a vacuum of not greater than $5 \times 10^{-6}$ Torr.

4. A method of manufacturing a magnetoresistive effect device according to claim 1, wherein said heat-treating is performed at a temperature of 210° C. to 230° C.

5. A method of manufacturing a magnetoresistive effect device according to claim 1, wherein said first non-magnetic electrically conductive layer, said free magnetic layer, and said second non-magnetic electrically conductive layer are formed by a DC magnetron sputtering-process.

6. A method of manufacturing a magnetoresistive effect device according to claim 1, wherein said first antiferromagnetic layer and said second antiferromagnetic layer comprise a PtMn alloy comprising 44 to 51 atomic percent of Pt and 49 to 56 atomic percent of Mn.

7. A method of manufacturing a magnetoresistive effect device according to claim 1, wherein said first pinned magnetic layer and said second pinned magnetic layer comprise one of an FeNi alloy, Co, a FeCo alloy, and a Fe—Co—Ni alloy.

8. A method of manufacturing a magnetoresistive effect device according to claim 1, wherein said heat-treating is performed in a magnetic field of 2000 Oe.

9. A method of manufacturing a magnetoresistive effect device, said method comprising:

forming a first free magnetic layer on a substrate, forming a first non-magnetic electrically conductive layer on said first free magnetic layer, forming a first pinned magnetic layer on said first non-magnetic electrically conductive layer by a DC magnetron sputtering process, forming an antiferromagnetic layer made of a PtMn alloy on said first pinned magnetic layer in direct contact by a DC magnetron sputtering process, forming a second pinned magnetic layer on said antiferromagnetic layer in direct contact relation by a DC magnetron sputtering process, forming a second non-magnetic electrically conductive layer on said second pinned magnetic layer, forming a second free magnetic layer on said second non-magnetic electrically conductive layer, and heat-treating said first pinned magnetic layer, said antiferromagnetic layer, and said second pinned magnetic layer in a magnetic field at a temperature of between 210° C. and 250° C.

10. The method of manufacturing a magnetoresistive effect device according to claim 9, wherein said PtMn alloy has a composition of Pt—Mn—X, and X represents at least one element selected from Ni, Pd, Rh, Ru, Ir, Cr, Fe and Co.

11. The method of manufacturing a magnetoresistive effect device according to claim 9, wherein said heat treatment is performed in a vacuum of not greater than $5 \times 10^{-6}$ Torr.

12. A method of manufacturing a magnetoresistive effect device according to claim 9, wherein said heat-treating is performed at a temperature of 210° C. to 230° C.

13. A method of manufacturing a magnetoresistive effect device according to claim 9, wherein said antiferromagnetic layer comprises a PtMn alloy comprising 44 to 51 atomic percent of Pt and 49 to 56 atomic percent of Mn.

14. A method of manufacturing a magnetoresistive effect device according to claim 9, wherein said first pinned magnetic layer and said second pinned magnetic layer comprise one of an FeNi alloy, Co, a FeCo alloy, and a Fe—Co—Ni alloy.

15. A method of manufacturing a magnetoresistive effect device according to claim 9, wherein said heat-treating is performed in a magnetic field of 2000 Oe.

* * * * *